(12) United States Patent
Chen et al.

(10) Patent No.: US 12,464,773 B2
(45) Date of Patent: Nov. 4, 2025

(54) FORMATION OF A SEMICONDUCTOR DEVICE WITH A GATE CONTAINING A METAL OXIDE LAYER USING AN OXIDATION PROCESS

(71) Applicant: Taiwan Semiconductor Manufacturing Company, Ltd., Hsinchu (TW)

(72) Inventors: Chia-Wei Chen, Hsinchu (TW); Jo-Chun Hung, Hsinchu (TW); Chih-Wei Lee, New Taipei (TW); Hui-Chi Chen, Zhudong Township, Hsinchu County (TW); Hsin-Han Tsai, Hsinchu (TW); Hsiang-Ju Liao, Changhua County (TW); Yi-Lun Li, Taipei (TW); Cheng-Lung Hung, Hsinchu (TW); Chi On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 869 days.

(21) Appl. No.: 17/677,422

(22) Filed: Feb. 22, 2022

(65) Prior Publication Data
US 2023/0268409 A1    Aug. 24, 2023

(51) Int. Cl.
*H10D 30/67* (2025.01)
*H01L 21/02* (2006.01)
(Continued)

(52) U.S. Cl.
CPC ... *H10D 30/6735* (2025.01); *H01L 21/02614* (2013.01); *H01L 21/76855* (2013.01);
(Continued)

(58) Field of Classification Search
CPC ........... H10D 84/0158; H10D 84/0193; H10D 84/834; H10D 84/853; H10D 86/011;
(Continued)

(56) References Cited

U.S. PATENT DOCUMENTS 8,836,016 B2    9/2014  Wu et al.
8,841,701 B2    9/2014  Lin et al.
(Continued)

*Primary Examiner* — Wael M Fahmy
*Assistant Examiner* — Aneesa Riaz Baig
(74) *Attorney, Agent, or Firm* — Birch, Stewart, Kolasch & Birch, LLP

(57) ABSTRACT

A semiconductor device structure and a formation method are provided. The method includes forming a fin structure over a substrate, and the fin structure has multiple sacrificial layers and multiple semiconductor layers laid out alternately. The method also includes removing the sacrificial layers to release multiple semiconductor nanostructures made up of remaining portions of the semiconductor layers. The method further includes forming a gate dielectric layer to wrap around the semiconductor nanostructures and forming a first metal-containing layer over the gate dielectric layer to wrap around the semiconductor nanostructures. In addition, the method includes introducing oxygen-containing plasma on the first metal-containing layer to transform an upper portion of the first metal-containing layer into a metal oxide layer. The method includes forming a second metal-containing layer over the metal oxide layer.

20 Claims, 30 Drawing Sheets

(51) Int. Cl.
  *H01L 21/768* (2006.01)
  *H10B 12/00* (2023.01)
  *H10D 30/43* (2025.01)
  *H10D 30/62* (2025.01)
  *H10D 62/10* (2025.01)
  *H10D 64/01* (2025.01)
  *H10D 64/66* (2025.01)
  *H10D 84/01* (2025.01)
  *H10D 86/01* (2025.01)

(52) U.S. Cl.
  CPC .. *H01L 21/76886* (2013.01); *H01L 21/76888* (2013.01); *H10D 30/62* (2025.01); *H10D 30/6757* (2025.01); *H10D 62/118* (2025.01); *H10D 62/119* (2025.01); *H10D 62/123* (2025.01); *H10D 64/01* (2025.01); *H10D 64/667* (2025.01); *H10D 84/0158* (2025.01); *H10D 86/011* (2025.01)

(58) Field of Classification Search
  CPC ..... H10D 86/215; H10D 30/024–0245; H10D 30/62–6219; H10D 30/43–435; H10D 30/6757; H10D 30/6735; H10D 30/501–509; H10D 30/014; H10D 30/019–0198; H10D 62/119–123; H10D 84/851; H10D 84/852; H10D 84/832; H10D 84/833; H10D 84/0135; H10D 84/014; H10D 84/0142; H10D 84/0172; H10D 84/0177; H10D 84/0179; H10D 64/017; H10D 64/517; H10D 64/518; H10D 30/673; H10B 12/36; H10B 12/056; H01L 21/28114; H01L 21/28088; H01L 21/02614; H01L 21/76855–76859; H01L 21/76886–76888
  See application file for complete search history.

(56) References Cited

U.S. PATENT DOCUMENTS

| | | | |
|---|---|---|---|
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,520,482 B1 | 12/2016 | Chang et al. | |
| 9,576,814 B2 | 2/2017 | Wu et al. | |
| 10,700,064 B1 * | 6/2020 | Zhang | B82Y 10/00 |
| 2016/0372565 A1 * | 12/2016 | Huang | H10D 84/038 |
| 2019/0081152 A1 * | 3/2019 | Suh | H10D 62/121 |
| 2021/0134951 A1 * | 5/2021 | Chen | H10D 64/667 |
| 2021/0193844 A1 * | 6/2021 | Ramaswamy | H10D 62/299 |
| 2021/0265508 A1 * | 8/2021 | Chiang | H10D 30/62 |
| 2021/0313437 A1 * | 10/2021 | Chiang | H01L 23/53204 |
| 2022/0052173 A1 * | 2/2022 | More | H10D 64/017 |
| 2022/0231124 A1 * | 7/2022 | Lee | H01L 21/02631 |
| 2023/0268409 A1 * | 8/2023 | Chen | H10D 62/121 257/401 |

* cited by examiner

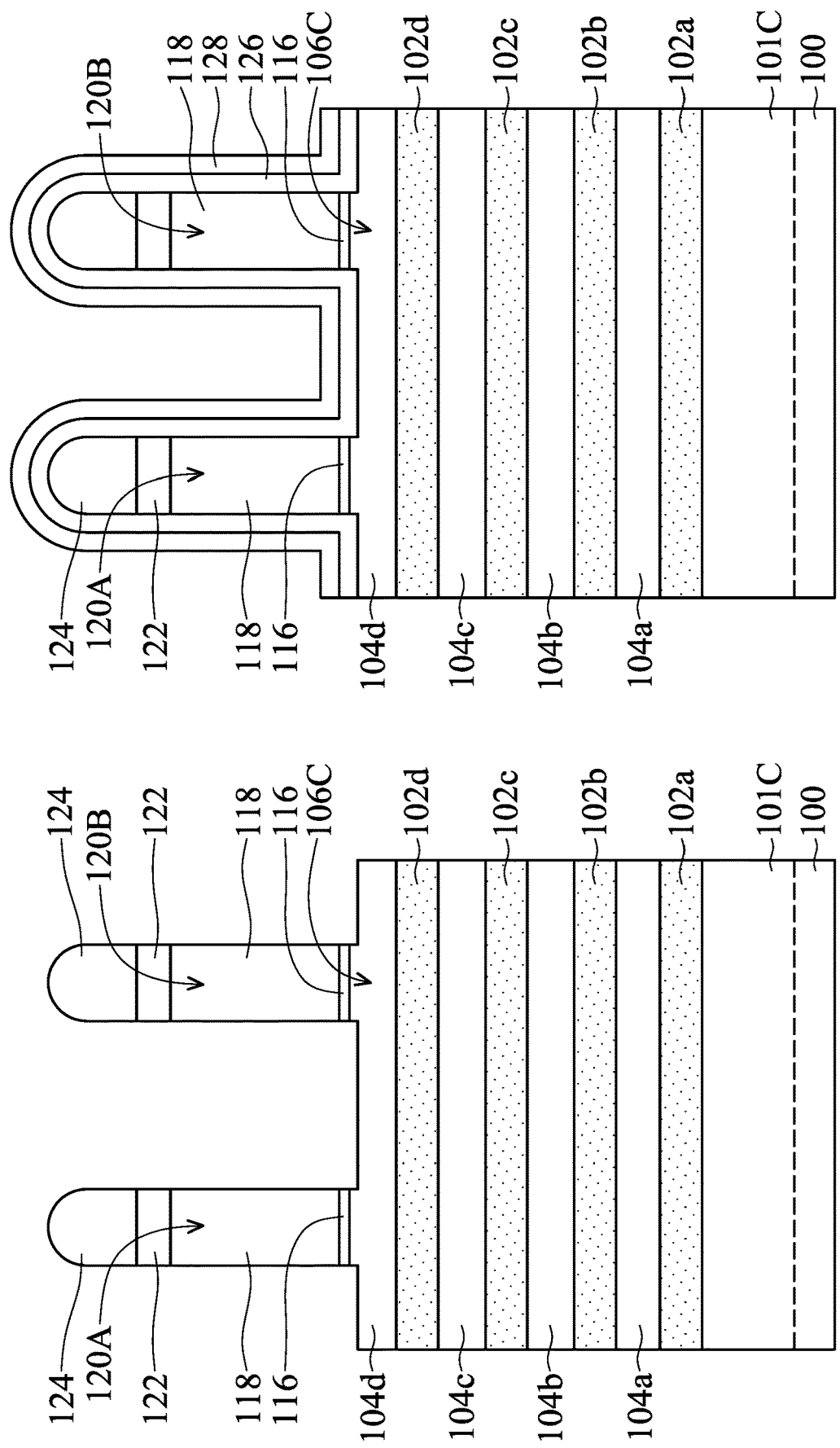

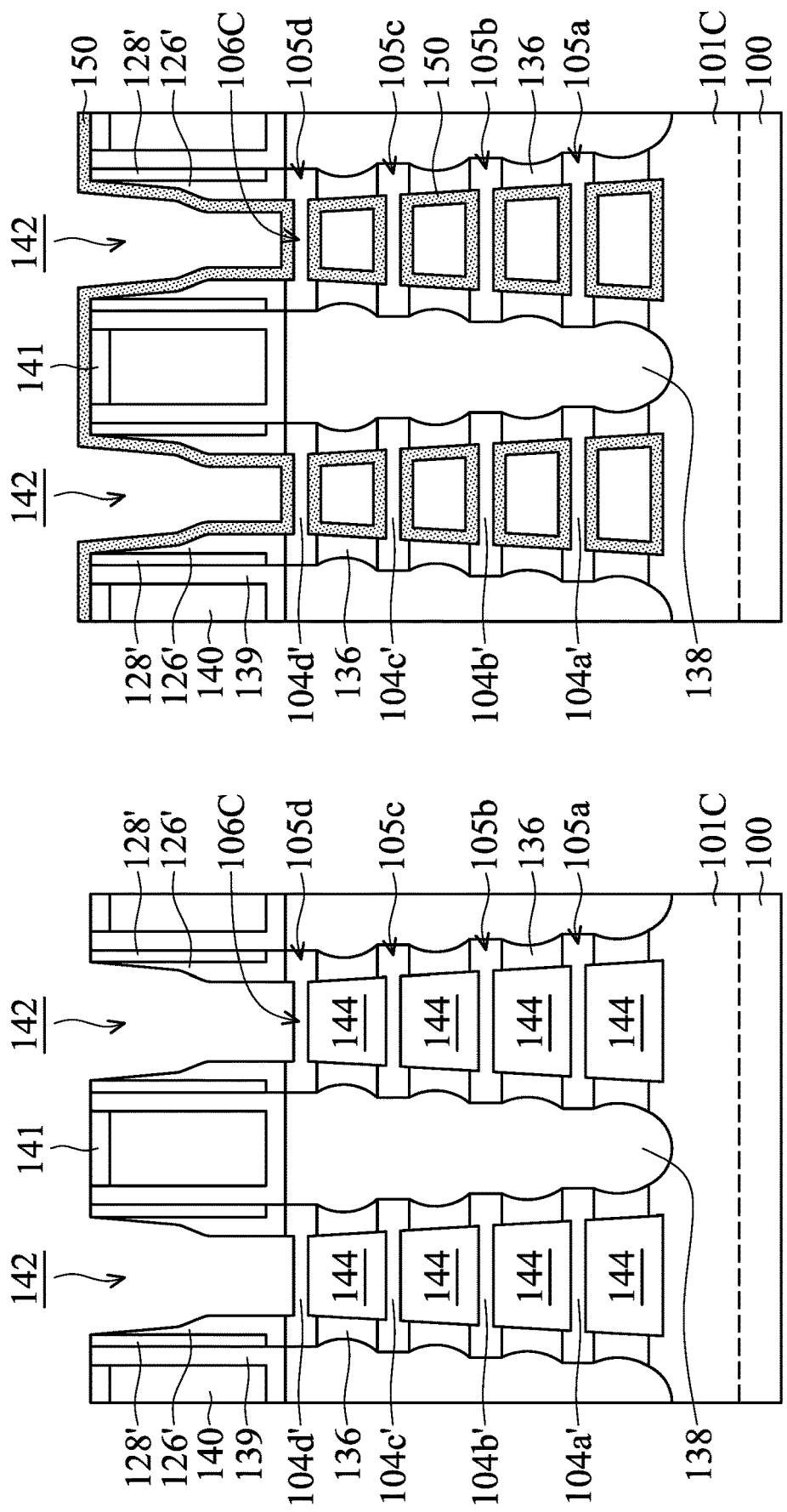

FORMATION OF A SEMICONDUCTOR DEVICE WITH A GATE CONTAINING A METAL OXIDE LAYER USING AN OXIDATION PROCESS

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
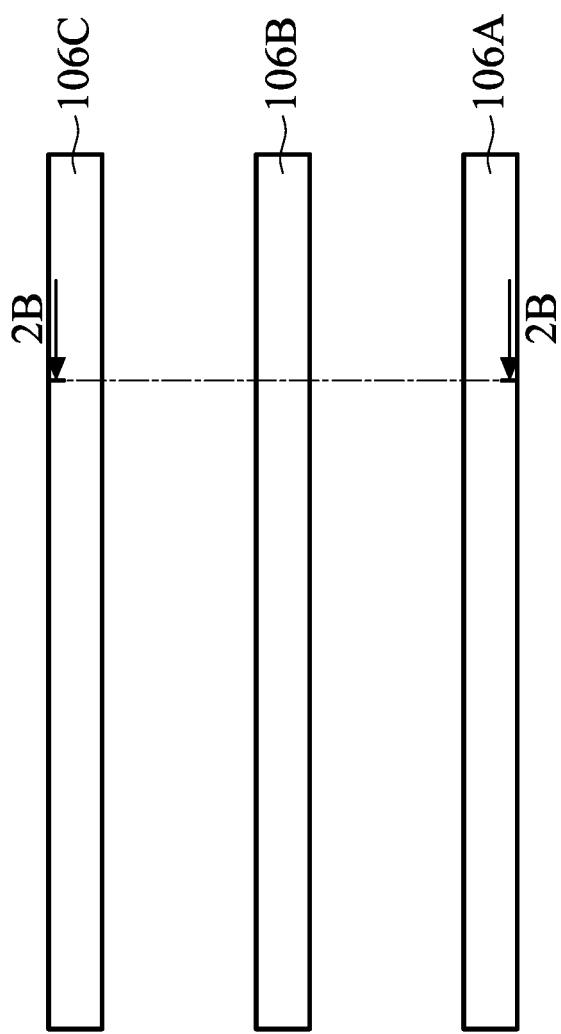
FIGS. 1A-1B are top views of various stages of a process for forming a portion of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) car feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100% of what is specified. Furthermore, terms such as "substantially parallel" or "substantially perpendicular" are to be interpreted as not to exclude insignificant deviation from the specified arrangement and may include for example deviations of up to 10 degrees in some embodiments. The word "substantially" does not exclude "completely" e.g. composition which is "substantially free" from Y may be completely free from Yin some embodiments.

Terms such as "about" in conjunction with a specific distance or size are to be interpreted so as not exclude insignificant deviation from the specified distance or size and may include for example deviations of up to 10% of what is specified in some embodiments. The term "about" in relation to a numerical value x may mean x±5 or 10% of what is specified in some embodiments.

Embodiments of the disclosure may relate to FinFET structure having fins. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Embodiments of the disclosure may relate to the gate all around (GAA) transistor structures. The GAA structure may be patterned using any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process, For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure, Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2A:
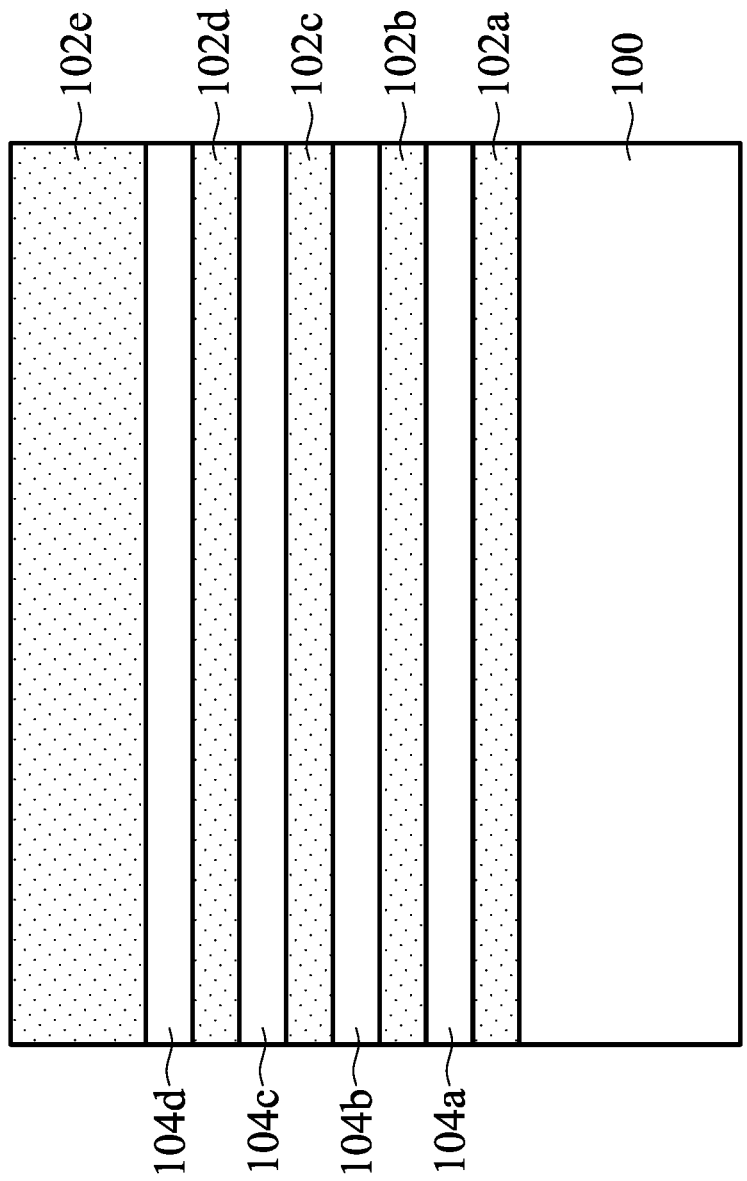
FIGS. 2A-2R are cross-sectional views of various stages of a process for forming a portion of a semiconductor device structure, in accordance with some embodiments.
Figure 2B:
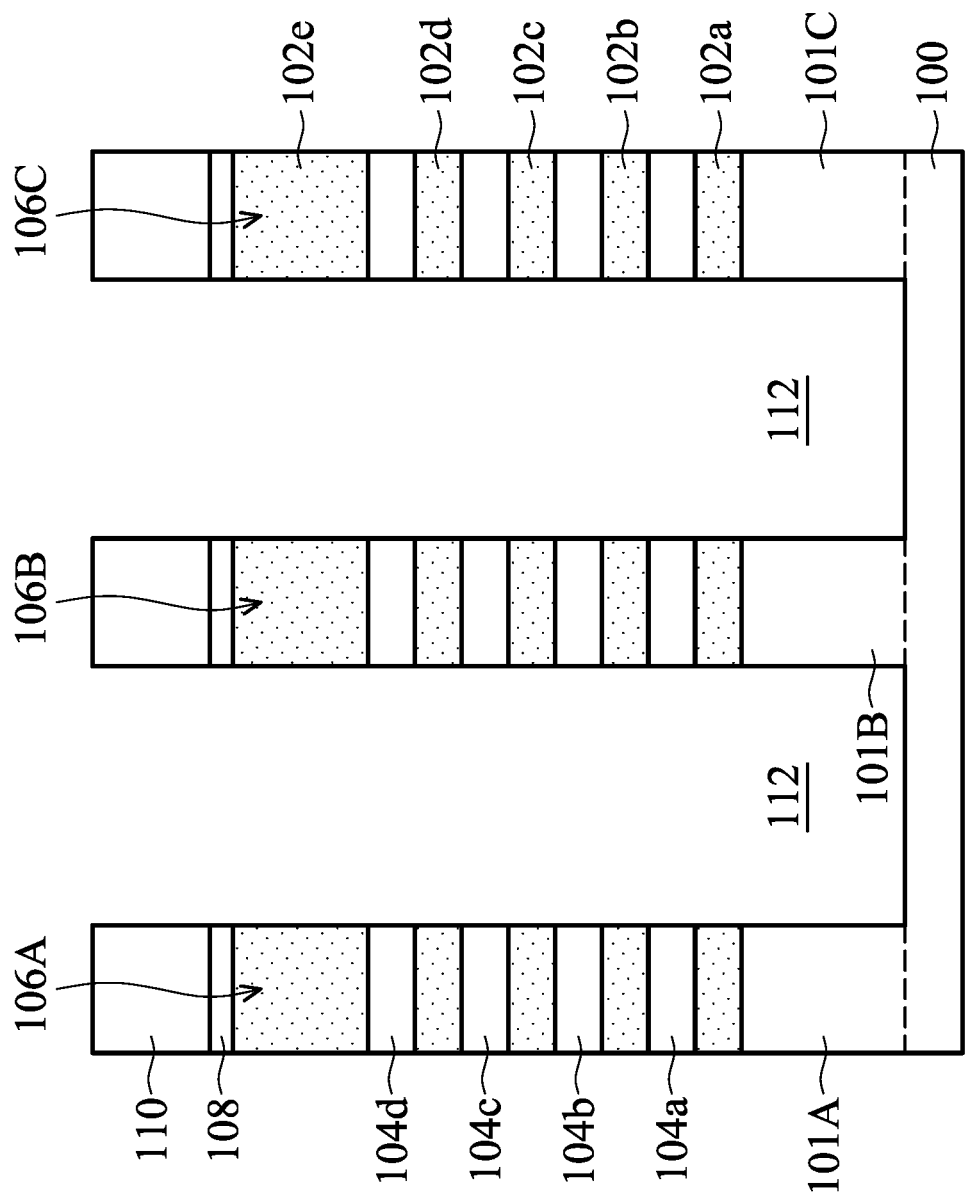
Figure 2C:
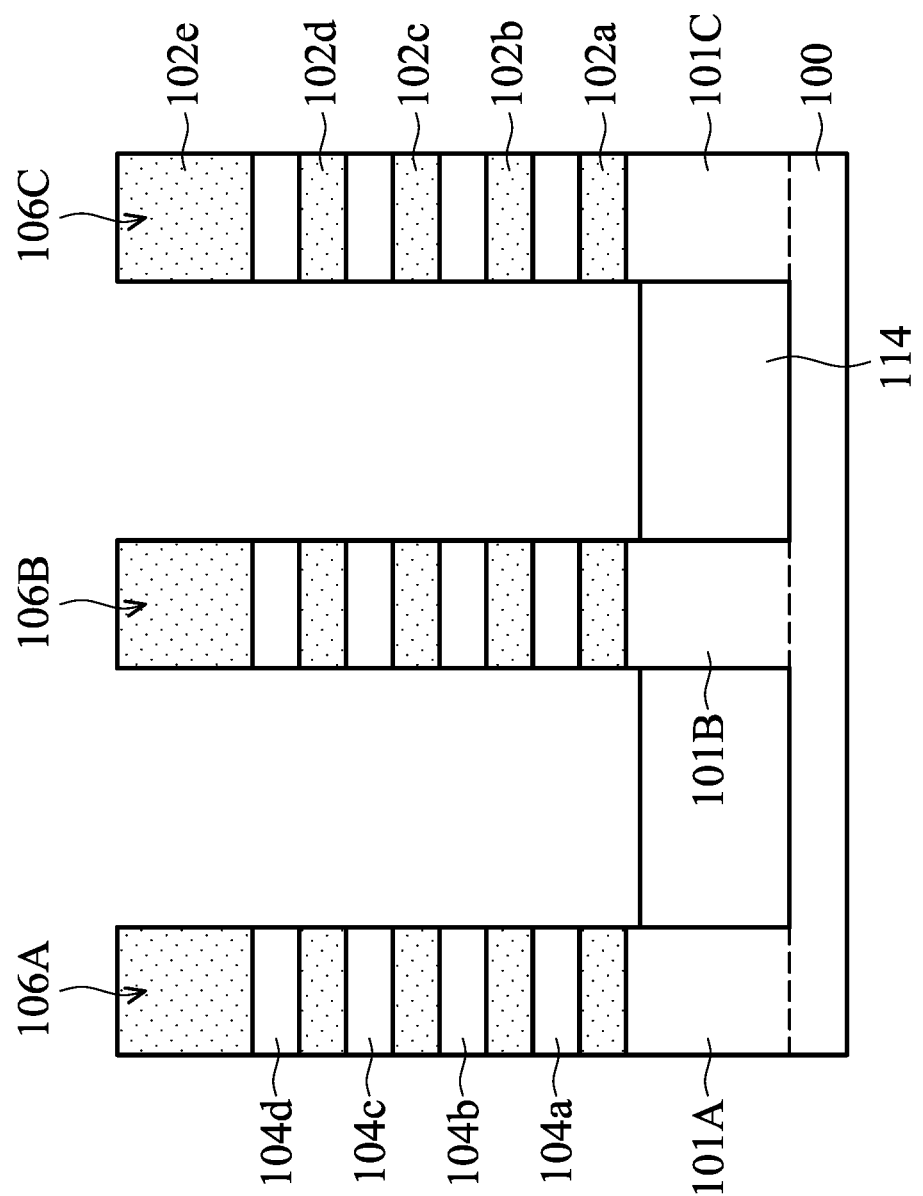
Figure 2D:
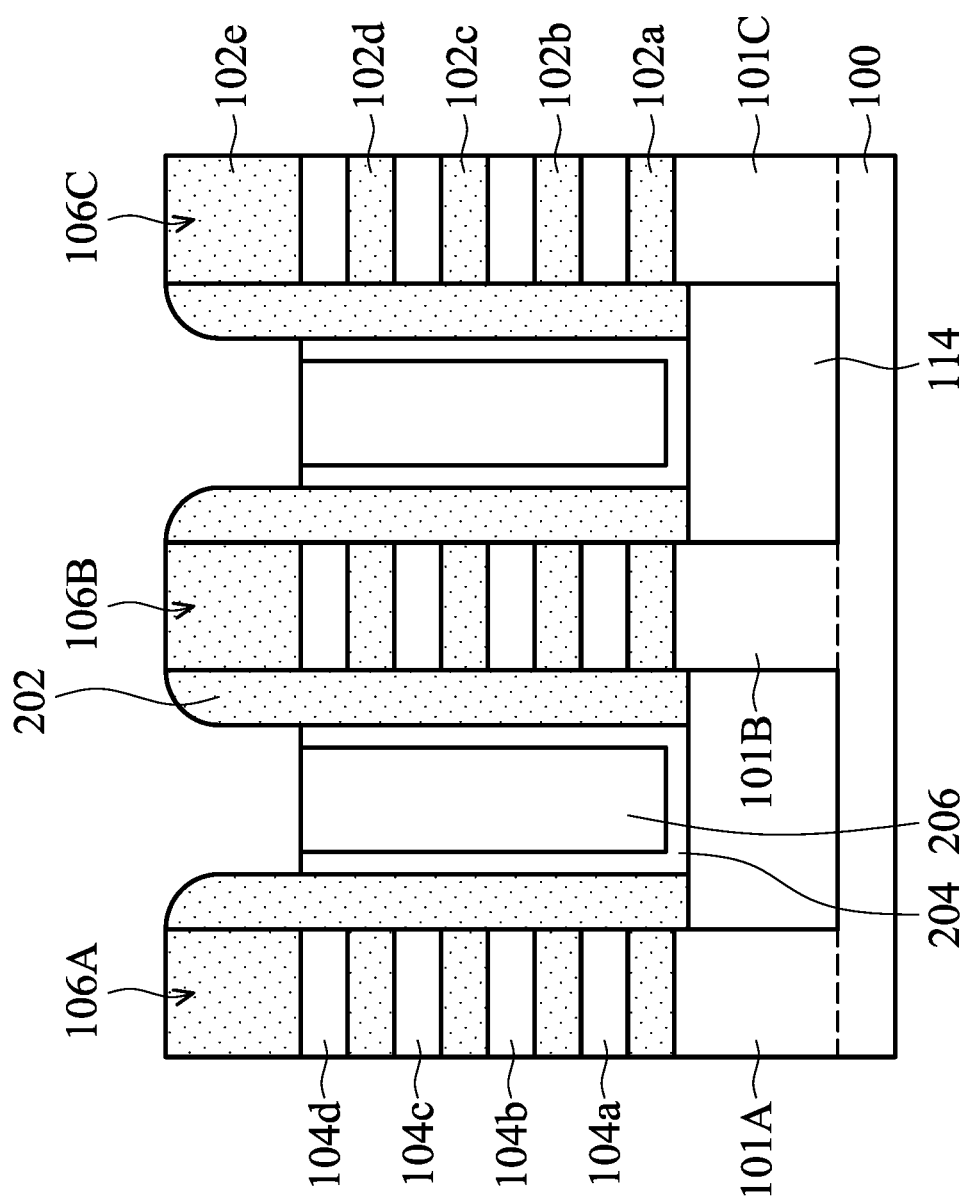
Figure 2E:
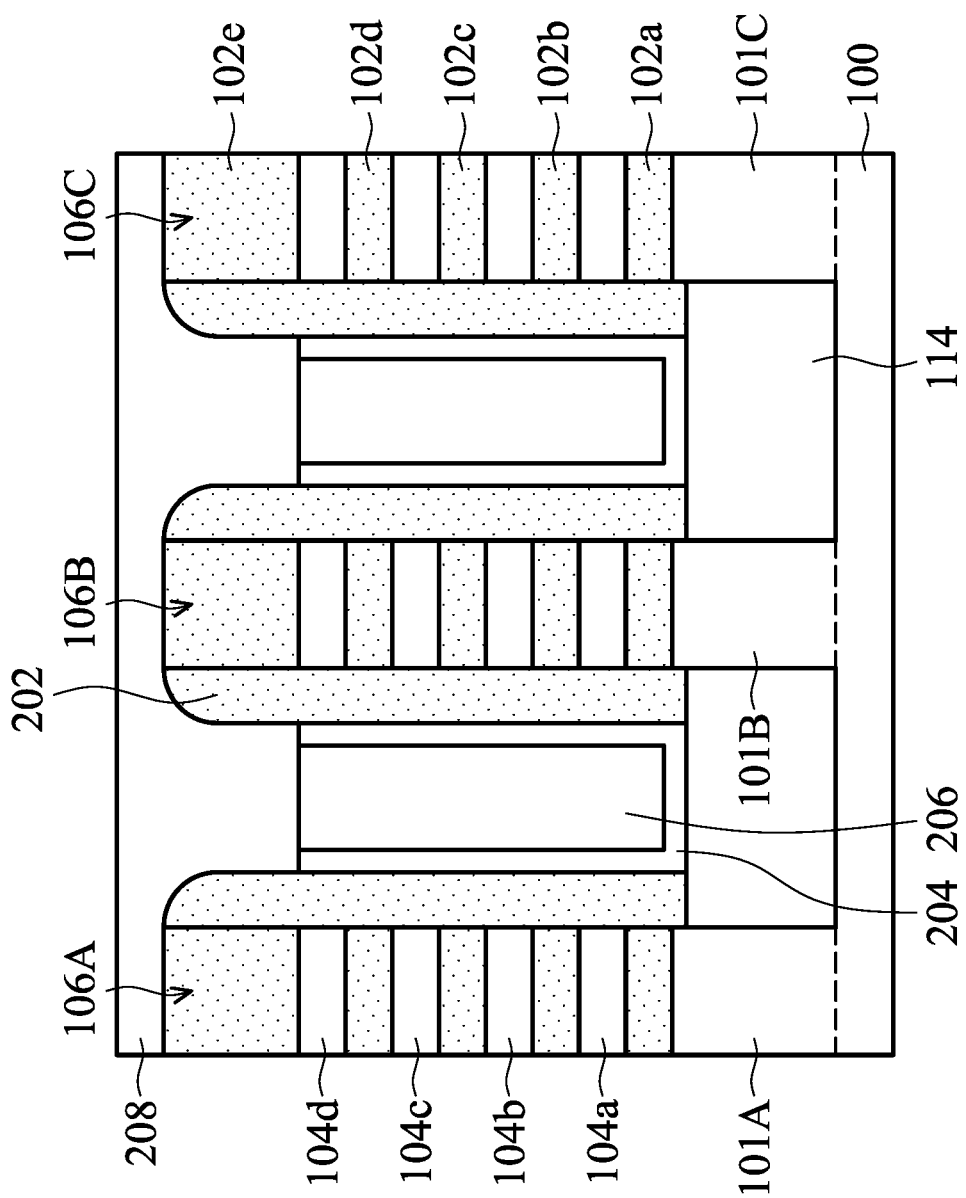
Figure 2F:
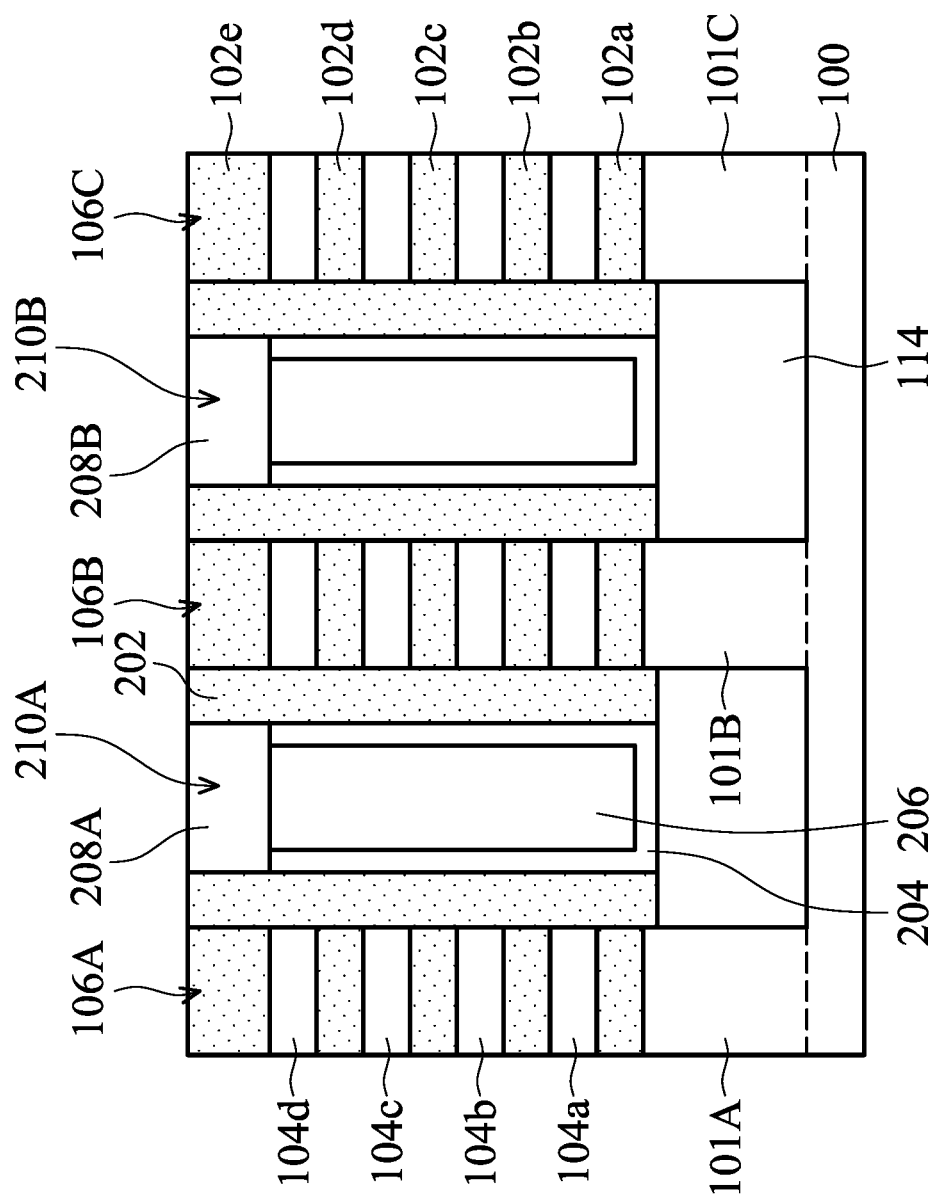
Figure 2G:
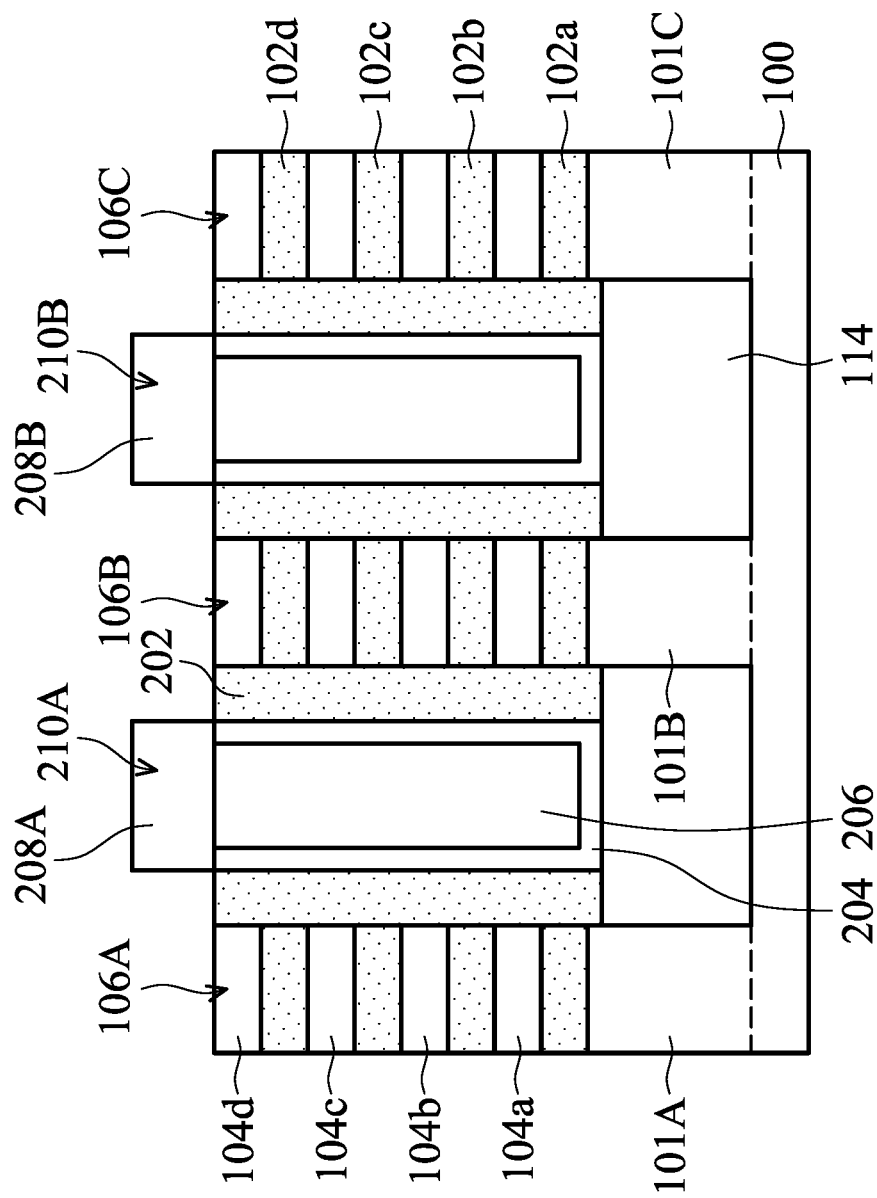
Figure 2H:
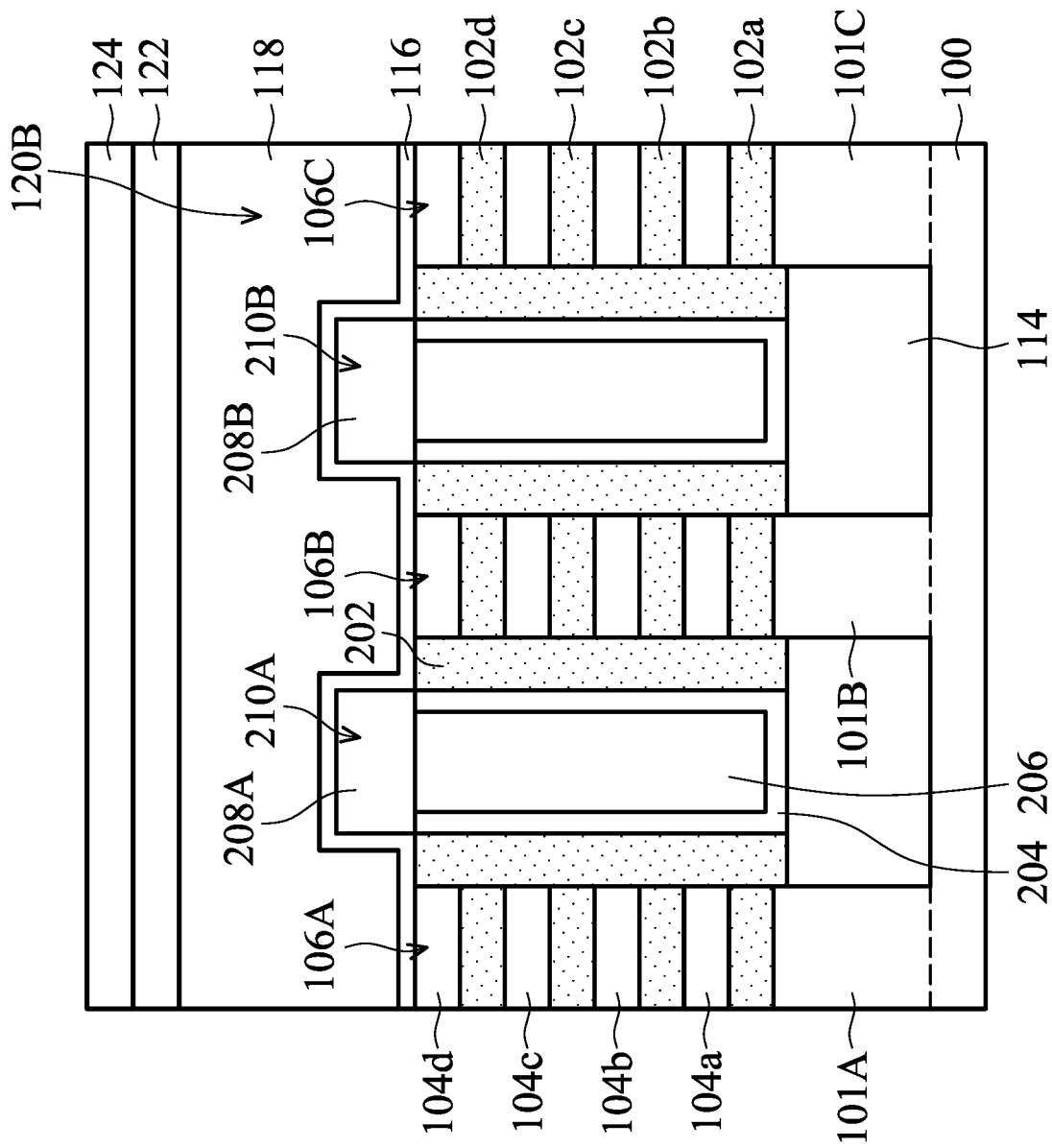
Figure 2I:
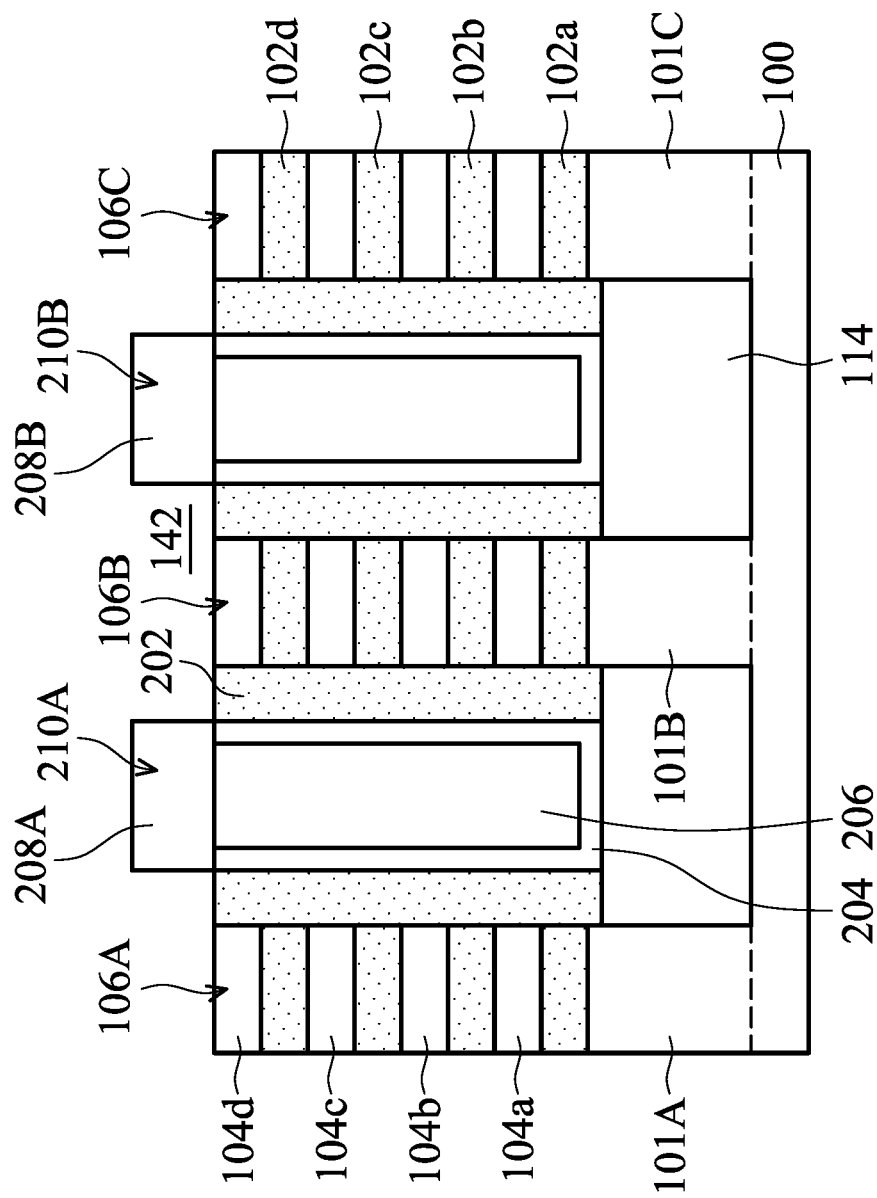
Figure 2J:
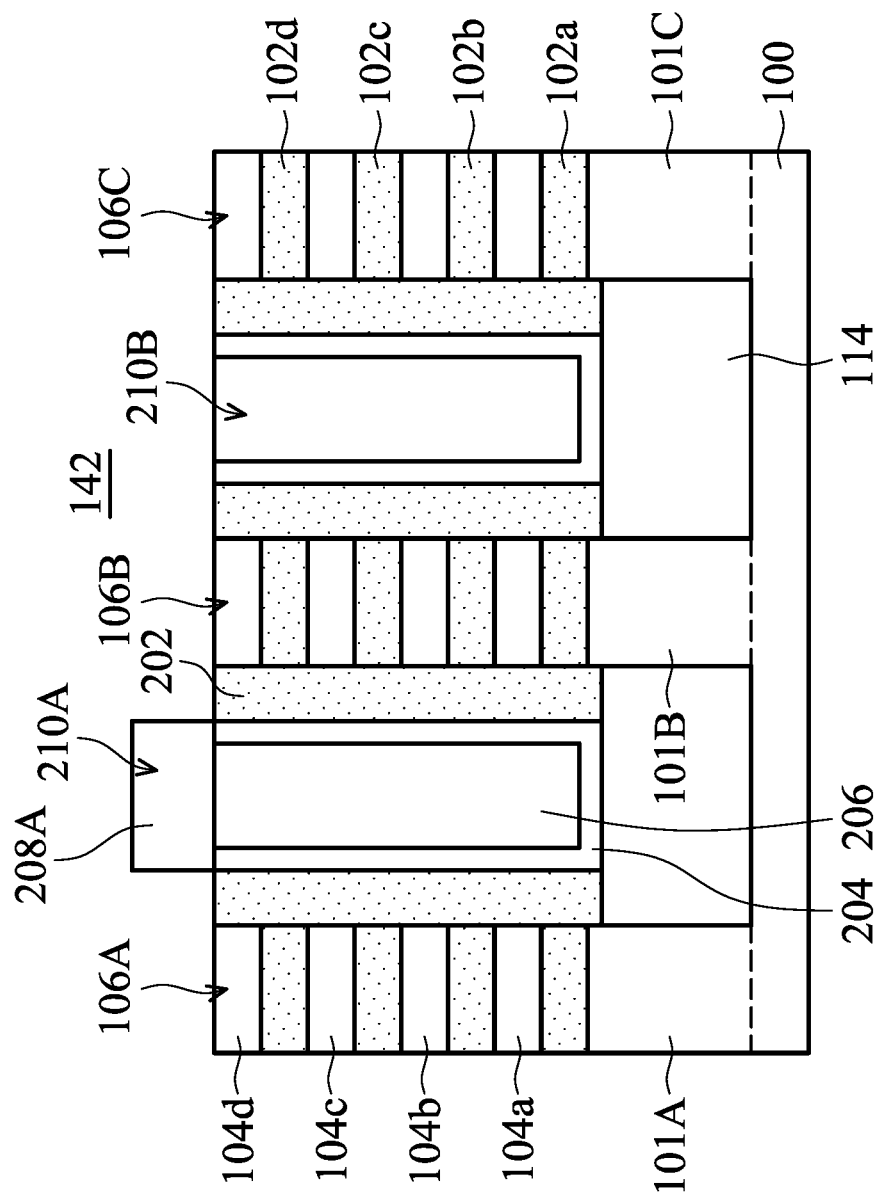
Figure 2K:
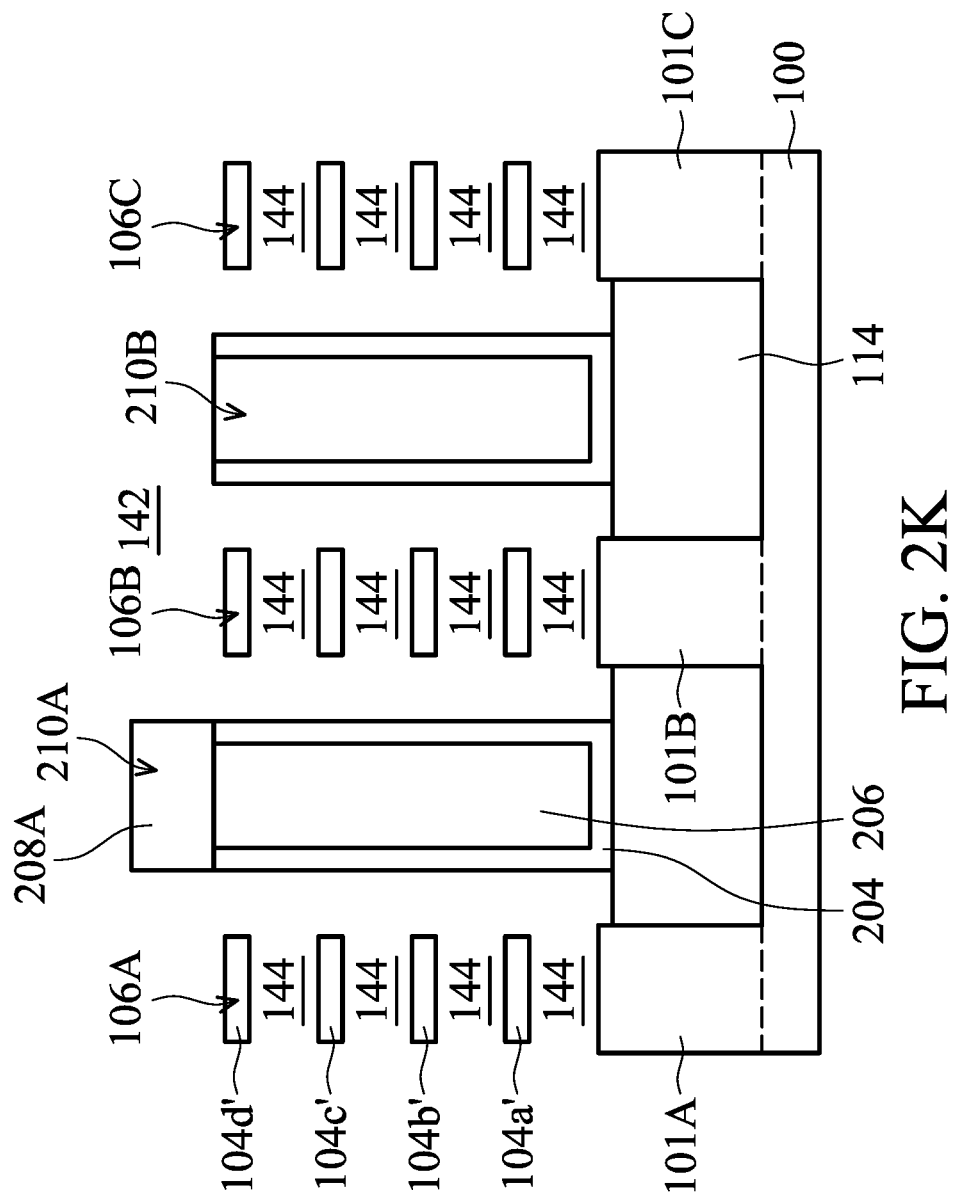
Figure 2L:
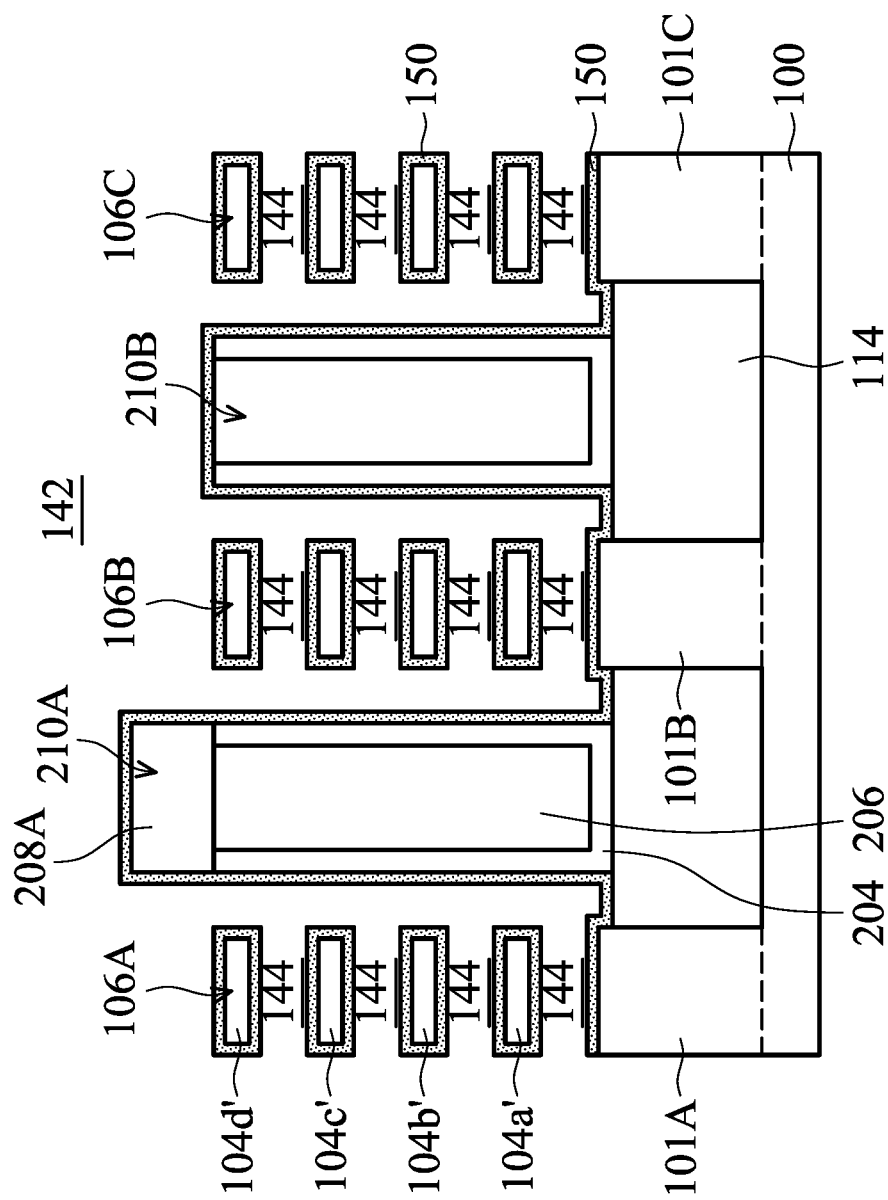
Figure 2M:
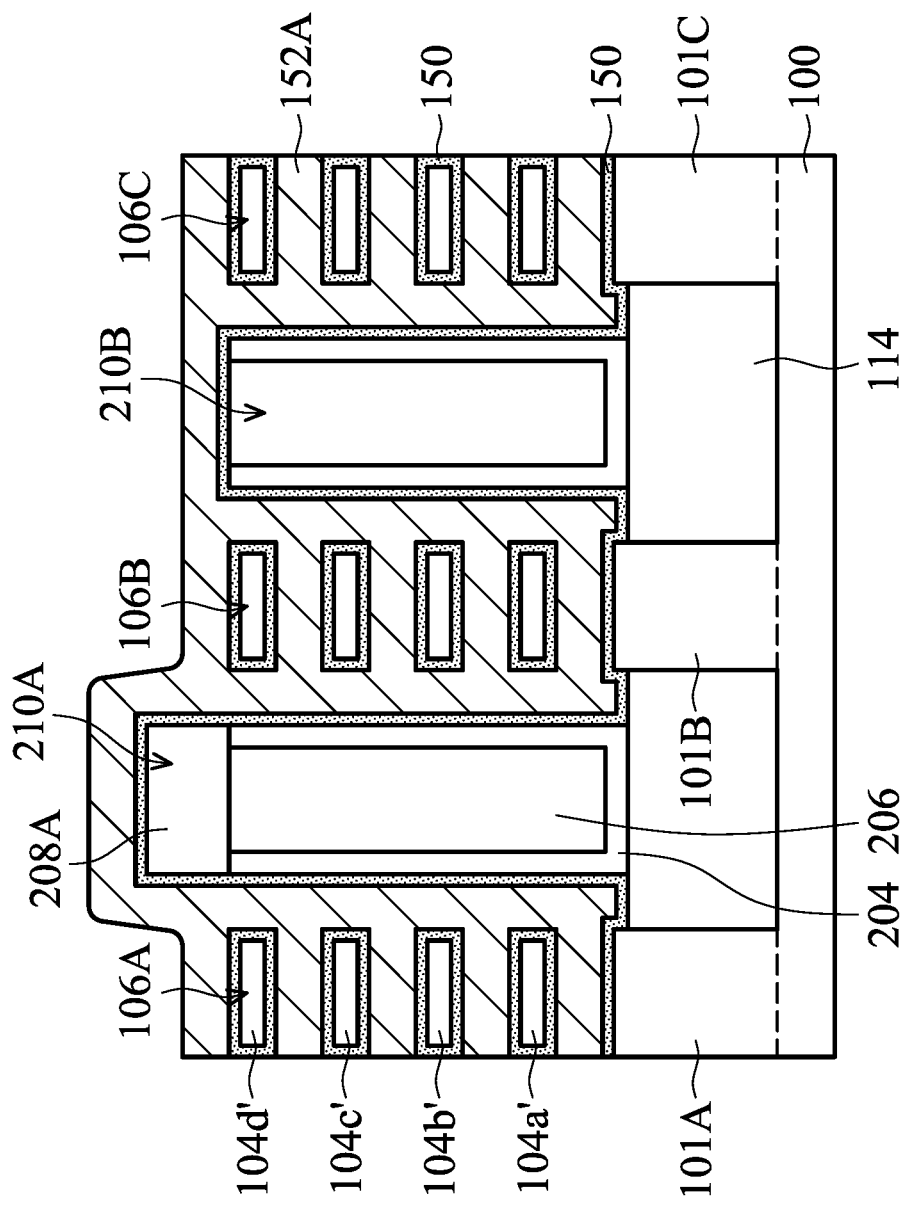
Figure 2N:
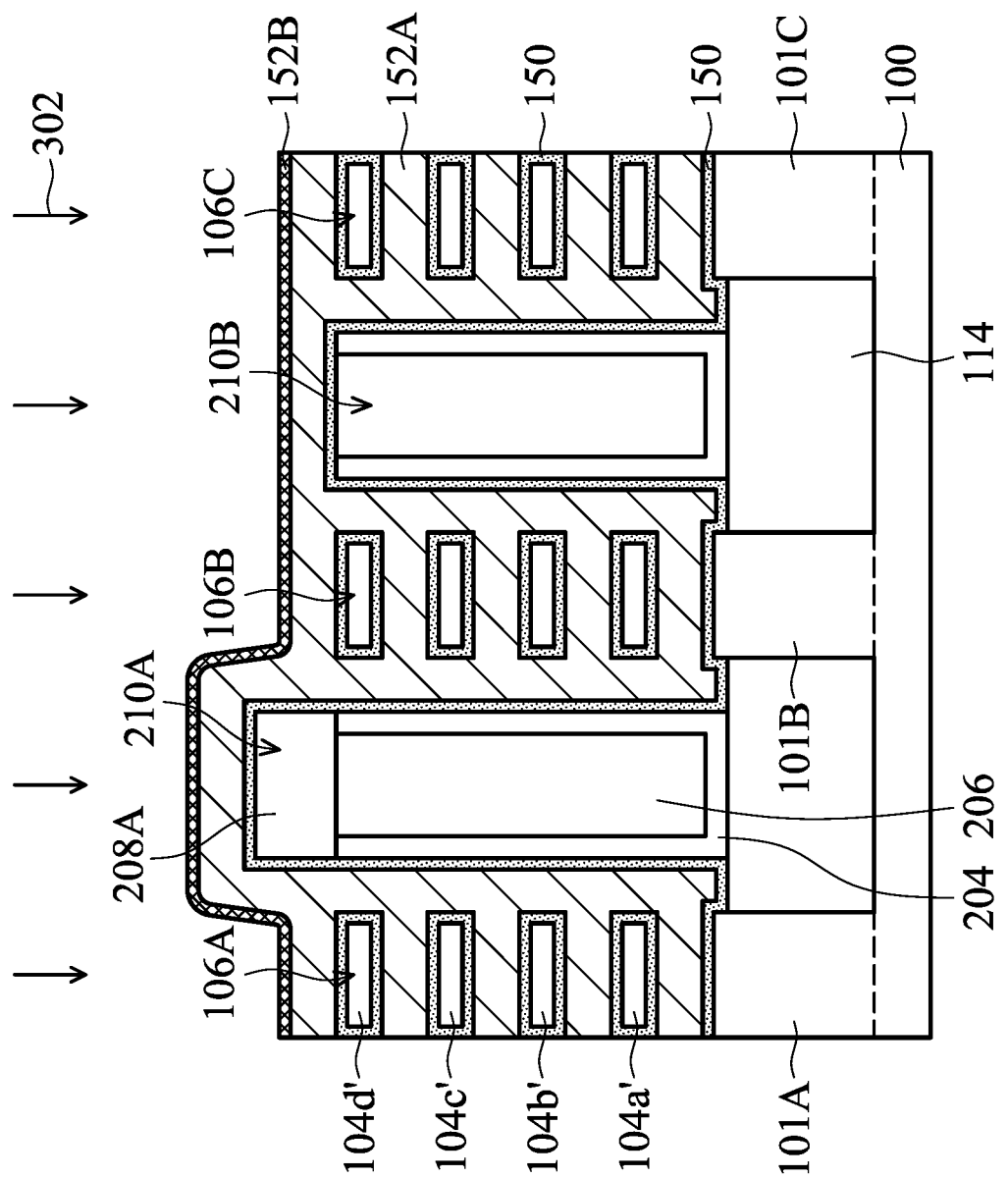
Figure 2O:
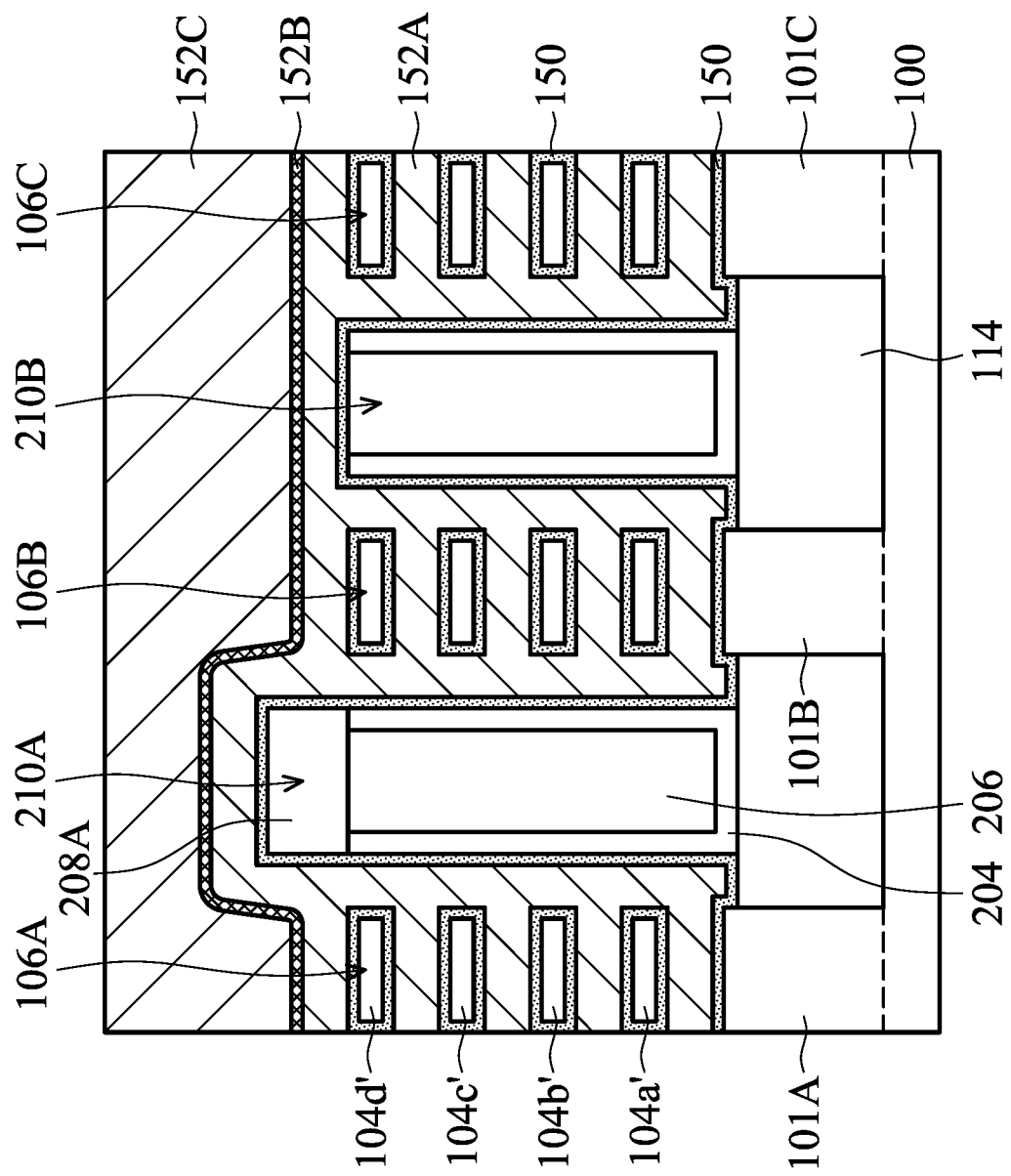
Figure 2P:
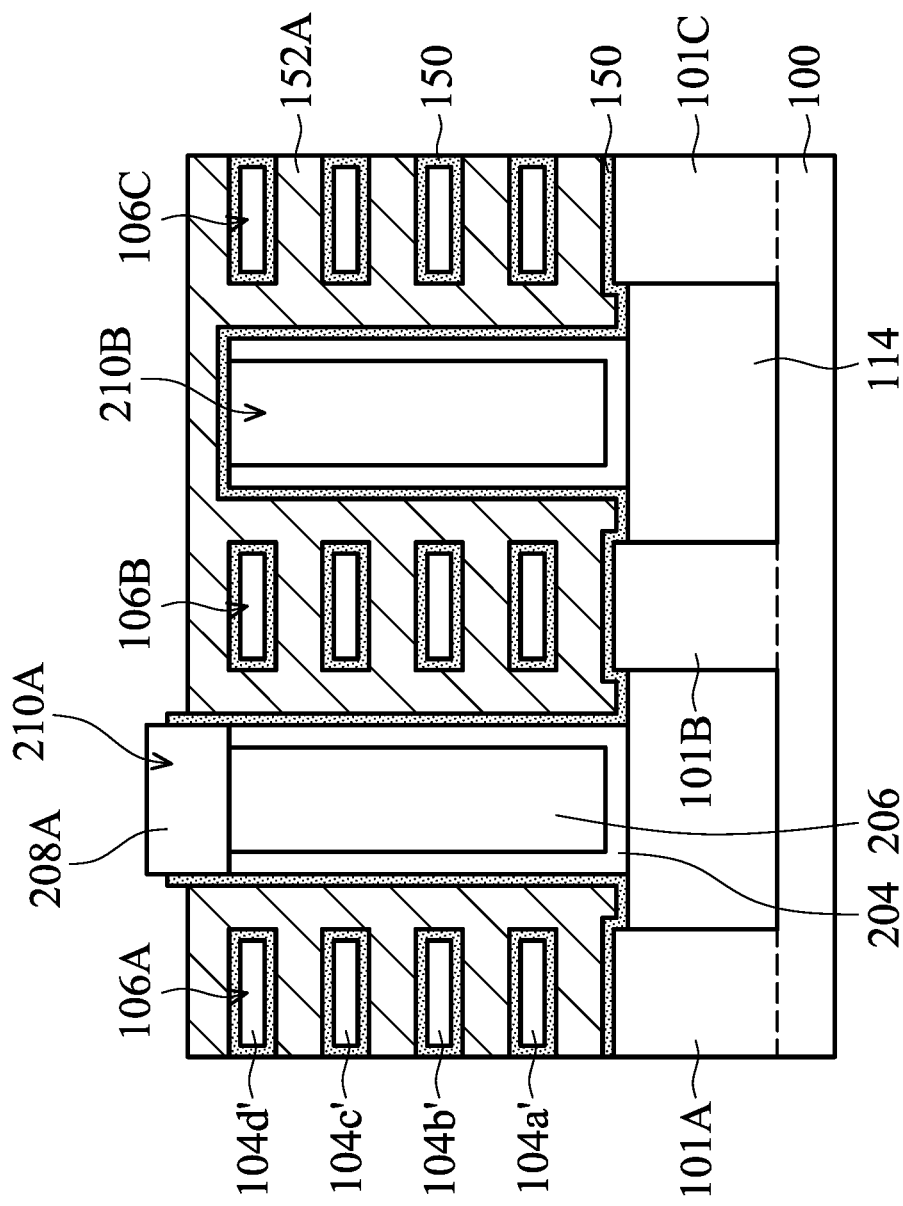
Figure 2Q:
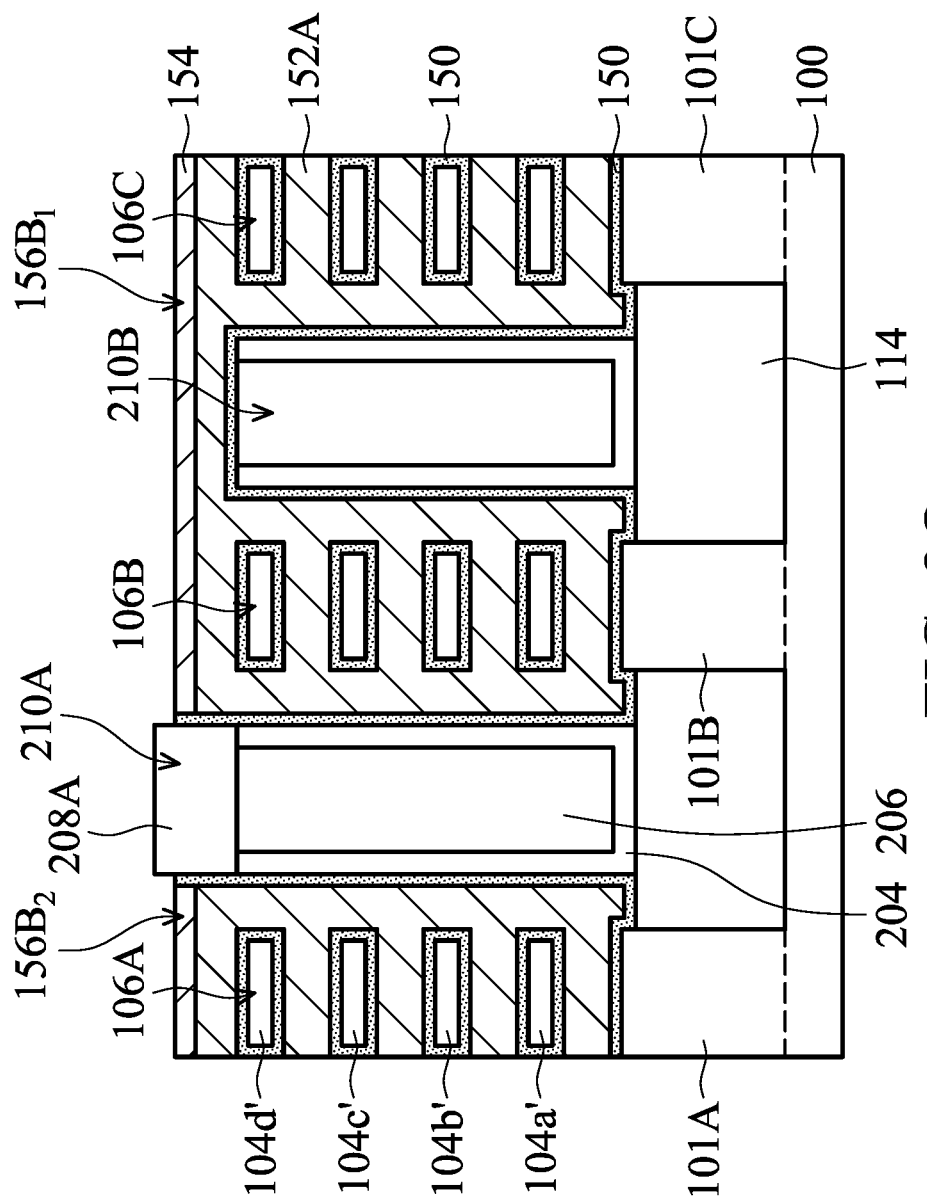
Figure 2R:
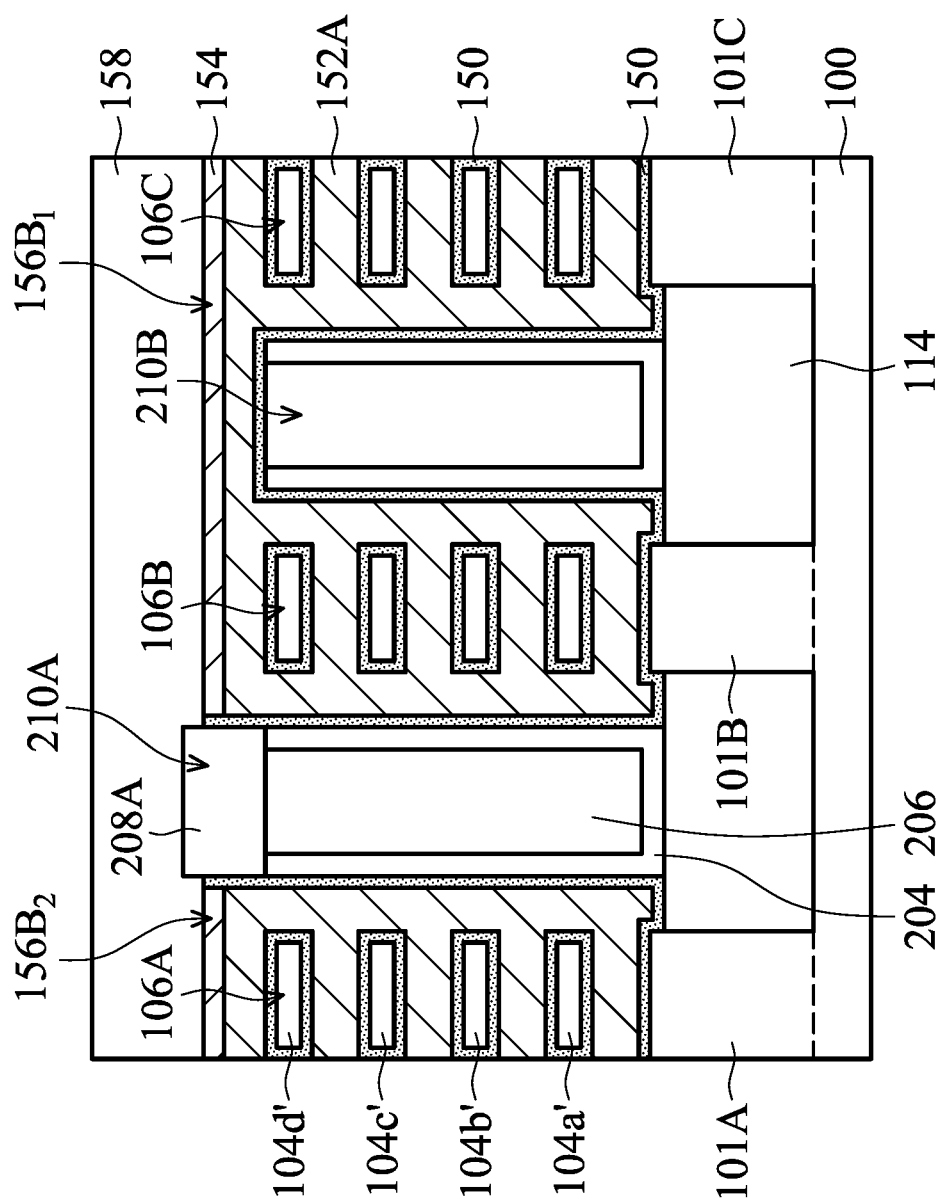

FIGS. 2A-2R are cross-sectional views of various stages of a process for forming a portion of a semiconductor device structure, in accordance with some embodiments, As shown in FIG. 2A, a semiconductor substrate 100 is received or provided. In some embodiments, the semiconductor substrate 100 is a bulk semiconductor substrate, such as a semiconductor wafer. The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}A_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 2A, a semiconductor stack having multiple semiconductor layers is formed over the semiconductor substrate 100, in accordance with some embodiments. In some embodiments, the semiconductor stack includes multiple semiconductor layers 102a, 102b, 102c, 102d, and 102e, and the semiconductor stack also includes multiple semiconductor layers 104a, 104b, 104c, and 104d, In some embodiments, the semiconductor layers 102a-102e and the semiconductor layers 104a-104e are laid out alternately, as shown in FIG. 2A. In some embodiments, the semiconductor layer 102e is thicker than each of the semiconductor layers 102a-102e.

In some embodiments, the semiconductor layers 102a-102e function as sacrificial layers that will be removed in subsequent processes. The semiconductor layers 104a-104d may function as channel structures of one or more transistors after the removal of the semiconductor layers 102a-102e.

In some embodiments, the semiconductor layers 104a-104d that will be used to form channel structures are made of a material that is different than that of the semiconductor layers 102a-102e. In some embodiments, the semiconductor layers 104a-104d are made of or include silicon or silicon germanium. In some embodiments, the semiconductor layers 102a-102e are made of or include silicon germanium with different atomic concentrations of germanium than that of the semiconductor layers 104a-104d, so as to achieve different etching selectivity and/or different oxidation rates during subsequent processing. In some embodiments, the semiconductor layer 102a-102e have a greater atomic concentration of germanium that that of the semiconductor layers 104a-104d, In some embodiments, the semiconductor layer 104a-104d are substantially free of germanium.

The present disclosure contemplates that the semiconductor layers 102a-102e and the semiconductor layers 104a-104d include any combination of materials (such as semiconductor materials) that can provide desired etching selectivity, desired oxidation rate differences, and/or desired performance characteristics (e.g., materials that maximize current flow).

In some embodiments, the semiconductor layers 102a-102e and 104a-104d are formed using multiple epitaxial growth operations. Each of the semiconductor layers 102a-102e and 104a-104d may be formed using a selective epitaxial growth (SEG) process, a CVD process a vapor-phase epitaxy (VPE) process, a low-pressure chemical vapor deposition (LPCVD) process, and/or an ultra-high vacuum CVD (UHV-CVD process), a molecular beam epitaxy process, one or more other applicable processes, or a combination thereof. In some embodiments, the semiconductor layers 102a-102e and 104a-104d are grown in-situ in the same process chamber. In some, embodiments, the growth of the semiconductor layers 102a-102e and 104a-104d are alternately and sequentially performed in the same process chamber to complete the formation of the semiconductor stack. In some embodiments, the vacuum of the process chamber is not broken before the epitaxial growth of the semiconductor stack is accomplished, Afterwards, hard mask elements are formed over the semiconductor stack to assist in a subsequent patterning of the semiconductor stack. One or more photolithography processes and one or more etching processes are used to pattern the semiconductor stack into fin structures 106A, 106B, and 106C. as shown in FIG. 2B in accordance with some embodiments. The fin structures 106A-106C may be patterned by any suitable method. For example, the fin structures 106A-106C may be patterned using one or more photolithography processes, including double-patterning or multi-patterning processes. Double-patterning or multi-patterning processes may combine photolithography and self-aligned processes, allowing patterns to be created that have, for example, pitches smaller than what is otherwise obtainable using a single, direct photolithography process.

The semiconductor stack is partially removed to form trenches 112, as shown in FIG. 2B. Each of the fin structures 106A-106C may include portions of the semiconductor layers 102a-102e and 104a-104d and protruding portions of the semiconductor substrate 100. The semiconductor substrate 100 may also be partially removed during the etching process that forms the fin structures 106A-106C. Protruding portions of the semiconductor substrate 100 that remain form the semiconductor fins 101A, 101B, and 101C, as shown in FIG. 2B.

Each of the hard mask elements may include a first mask layer 108 and a second mask layer 110. The first mask layer 108 and the second mask layer 110 may be made of different materials. In some embodiments, the first mask layer 108 is made of a material that has good adhesion to the semiconductor layer 102e. The first mask layer 108 may be made of silicon oxide, germanium oxide, silicon germanium oxide, one or more other suitable materials, or a combination thereof. In some embodiments, the second mask layer 110 is made of a material that has good etching selectivity to the semiconductor layers 102a-102e and 104a-104d. The second mask layer 110 may be made of silicon nitride, silicon oxynitride, silicon carbide, one or more other suitable materials, or a combination thereof.

Figure 1B:
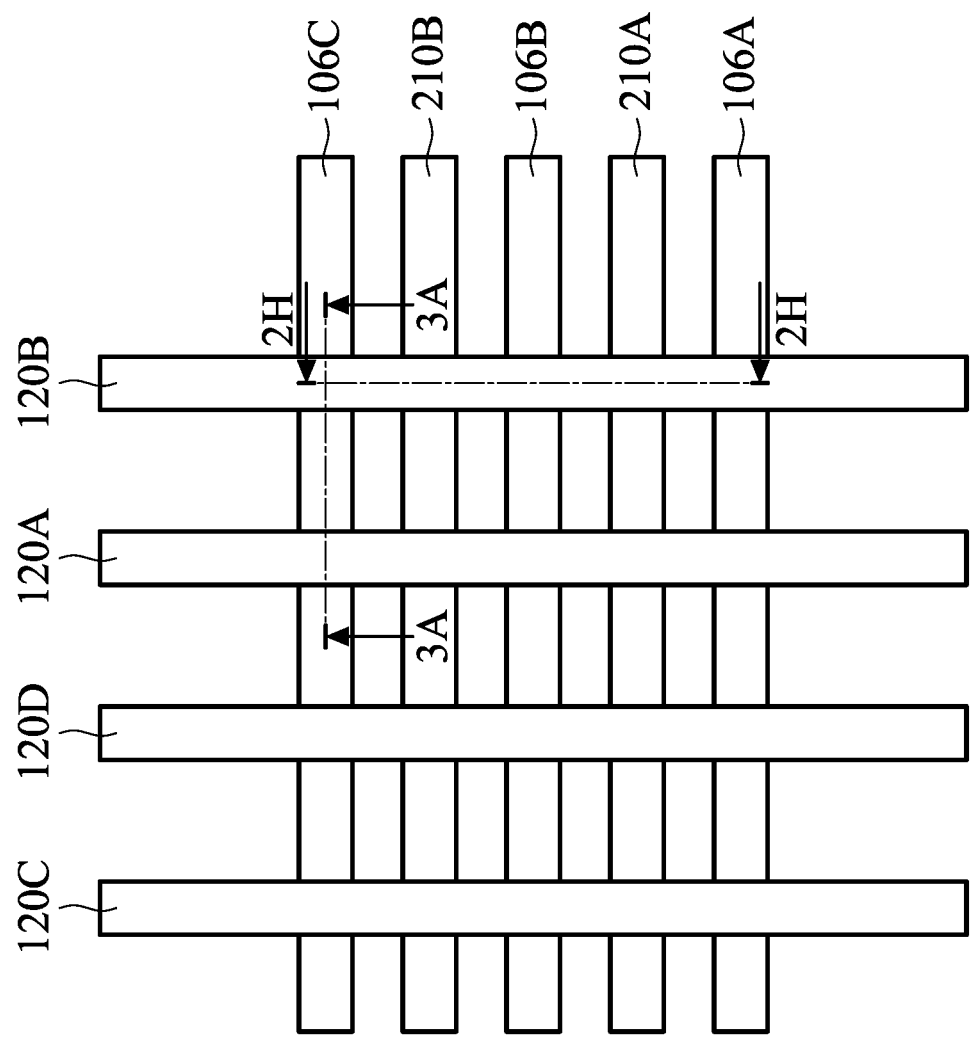

FIGS. 1A-1B are top views of various stages of a process for forming a portion of a semiconductor device structure, in accordance with some embodiments. In some embodiments, the fin structures 106A-106C are oriented lengthwise. In some embodiments, the extending directions of the fin structures 106A-106C are substantially parallel to each other, as shown in FIG. 1A. In some embodiments, FIG. 2B is a cross-sectional view of the structure taken along the line 2B-2B in FIG. 1A.

As shown in FIG. 2C, an isolation structure 114 is formed to surround lower portions of the fin structures 106A-106C, in accordance with some embodiments. In some embodiments, one or more dielectric layers are deposited over the fin structures 106A-106C and the semiconductor substrate 100 to overfill the trenches 112. The dielectric layers may be made of silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. The dielectric layers may be deposited using a flowable chemical vapor deposition (FCVD) process, an atomic layer deposition (ALD) process, a chemical vapor deposition (CVD) process, one or more other applicable processes, or a combination thereof.

Afterwards, a planarization process is used to partially remove the dielectric layers. The hard mask elements (including the first mask layer 108 and the second mask layer 110) may also function as a stop layer of the planarization process. The planarization process may include a chemical mechanical polishing (CMP) process, a grinding process, a dry polishing process, an etching process, one or more other applicable processes, or a combination thereof. Afterwards, one or more etching back processes are used to partially remove the dielectric layers. As a result, the remaining portion of the dielectric layers forms the isolation structure 114. Upper portions of the fin structures 106A-106C protrude from the top surface of the isolation structure 114, as shown in FIG. 2C.

Afterwards, the hard mask elements (including the first mask layer 108 and the second mask layer 110) are removed. Alternatively, in some other embodiments, the hard mask elements are removed or consumed during the planarization process and/or the etching back process that forms the isolation structure 114.

As shown in FIG. 2D, sacrificial spacers 202 are formed over sidewalk of the fin structures 106A-106C, and dielectric layers 204 and 206 are sequentially formed to surround lower portions of the sacrificial spacers 202, in accordance with some embodiments. In some embodiments, a sacrificial material layer is formed on the fin structures 106A-106C, in accordance with some embodiments. In some embodiments, the sacrificial material layer is selectively formed only on the surfaces of semiconductor materials. In some embodiments, the sacrificial material layer is epitaxially grown on the surfaces of the fin structures 106A-106C. The material and formation method of the sacrificial material layer may be the same as or similar to those of the sacrificial layers 102a-102e. A suitable epitaxial growth time is used to form the sacrificial material layer to ensure that the sacrificial material layer is formed to have a suitable thickness.

Afterwards, dielectric layers 204 and 206 are sequentially formed over the sacrificial material layer and the isolation structure 114, in accordance with some embodiments. The dielectric layer 204 may be made of or include silicon nitride, silicon oxynitride, carbon-containing silicon nitride, carbon-containing silicon oxynitride, one or more other suitable materials, or a combination thereof. The dielectric layer 204 may be deposited using a CVD process, an ALD process, one or more other applicable processes, or a combination thereof. The dielectric layer 206 may be made of or include silicon oxide, silicon carbide, silicon oxycarbide, silicon nitride, silicon oxynitride, carbon-containing silicon nitride, carbon-containing silicon oxynitride, one or more other suitable materials, or a combination thereof. The dielectric layer 206 may be deposited using an FCVD process, a CVD process, an ALD process, one or more other suitable materials, or a combination thereof.

Then, a planarization process is used to partially remove the sacrificial material layer and the dielectric layers 204 and 206. Afterwards, an etching back process is used to remove upper portions of the dielectric layers 204 and 206. After the removal of the upper portions of the dielectric layers 204 and 206, multiple recesses are formed.

The etching back process may also slightly etch the sacrificial material layer. As a result, the remaining portions of the sacrificial material layer form the sacrificial spacers 202, as shown in FIG. 2D. The remaining portions of the dielectric layers 204 and 206 surround the lower portions of the sacrificial spacers 202, as shown in FIG. 213.

As shown in FIG. 2E, a protective layer 208 is deposited over the fin structures 106A-106C and the dielectric layers 204 and 206 to overfill the recesses, in accordance with some embodiments. In some embodiments, the protective layer 208 is made of a high-k dielectric material that has a dielectric constant that is greater than about 7. The protective layer 208 may be made of or include hafnium oxide, zirconium oxide, aluminum hafnium oxide, aluminum oxide, hafnium silicon oxide, one or more other suitable materials, or a combination thereof. The protective layer 208 may be deposited using a CVD process, an ALD process, one or more other applicable processes, or a combination thereof.

As shown in FIG. 2F, a planarization process is used to remove the portion of the protective layer 208 outside of the recesses. As a result, the remaining portions of the protective layer 208 in the recesses form protective structures 208A and 208B, as shown in FIG. 2F, The planarization process may include a CMP process, a grinding process, a dry polishing process, an etching process, one or more other applicable processes, or a combination thereof. The protective structure 208A and the dielectric layers 204 and 206 thereunder together form a dielectric fin structure 210A. The protective structure 208B and the dielectric layers 204 and 206 thereunder together form a dielectric fin structure 210B.

As shown in FIG. 2G, the semiconductor layers 102e and the upper portions of the sacrificial spacers 202 laterally surrounding the semiconductor layers 102e are removed, in accordance with some embodiments. As a result, the protective structures 208A and 208B protrude from the top surface of the remaining portions of the sacrificial spacers

202, An etching process may be used to remove the semiconductor layers 102e and the upper portions of the sacrificial spacers 202.

Figure 3D:
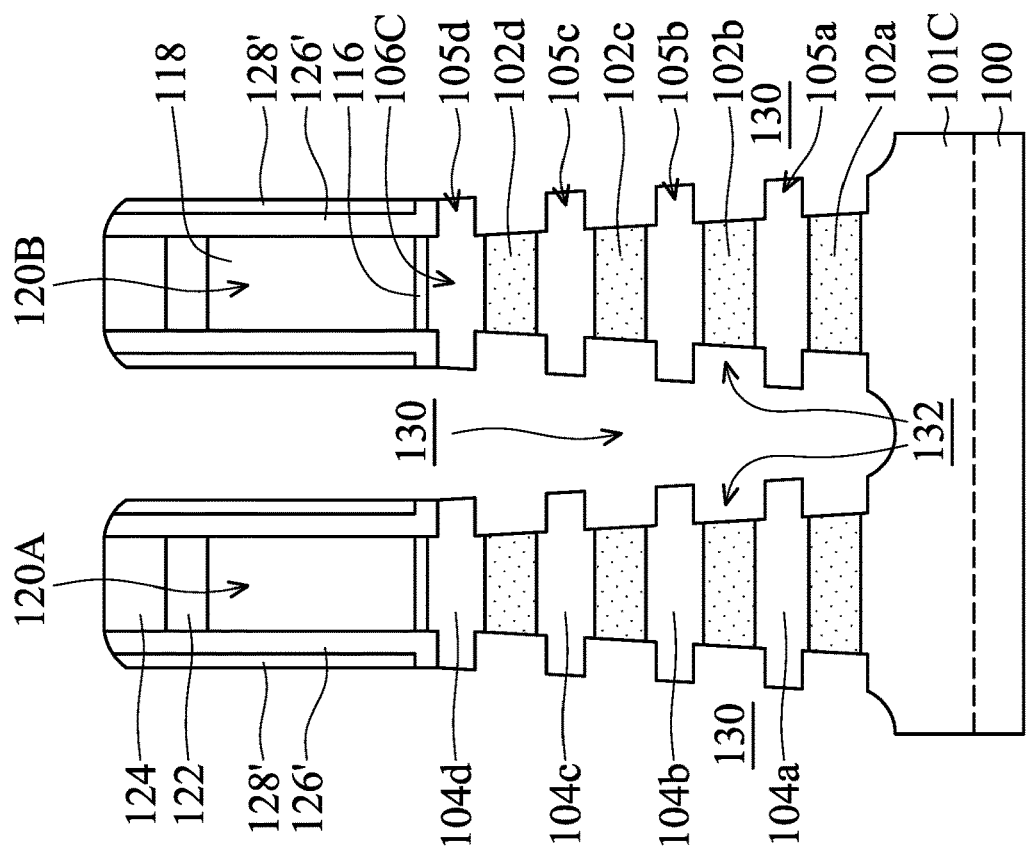
FIGS. 3A-3S are cross-sectional views of various stages of a process for forming a portion of a semiconductor device structure, in accordance with some embodiments.

Afterwards, dummy gate stacks 120A, 120B, 120C, and 120D are formed to extend across the fin structures 106A-106C, as shown in FIG. 1B in accordance with some embodiments. In some embodiments, FIG. 2H is a cross-sectional view of the structure taken along the line 2H-2H in FIG. 1B. FIGS. 3A-3S are cross-sectional views of various stages of a process for forming a portion of a semiconductor device structure, in accordance with some embodiments. In some embodiments, FIG. 3A is a cross-sectional view of the structure taken along the line 3A-3A in FIG. 1B.

As shown in FIGS. 1B, 2H, and 3A, the dummy gate stacks 120A-120D are formed to partially cover and to extend across the fin structures 106A-106C and the dielectric fin structures 210A and 210B, in accordance with some embodiments. As shown in FIGS. 1B and 2H, the dummy gate stack 120B extends across the fin structures 106A-106C and the dielectric fin structures 210A and 210B.

As shown in FIGS. 2H and 3A, each of the dummy gate stacks 120A and 12013 includes a dummy gate dielectric layer 116 and a dummy gate electrode 118. The dummy gate dielectric layers 116 may be made of or include silicon oxide. The dummy gate electrodes 118 may be made of or include polysilicon, In some embodiments, a dummy gate dielectric material layer and a dummy gate electrode layer are sequentially deposited over the fin structures 106A-106C, the sacrificial spacers 202, and the dielectric fin structures 210A and 210B, as shown in FIG. 2H. The dummy gate dielectric material layer may be deposited using an ALD process, a CVD process, one or more other applicable processes, or a combination thereof. The dummy gate electrode layer may be deposited using a CVD process. Afterwards, the dummy gate dielectric material layer and the dummy gate electrode layer are patterned to form multiple dummy gate stacks including the dummy gate stacks 120A and 120B shown in FIG. 3A.

In some embodiments, hard mask elements including mask layers 122 and 124 are used to assist in the patterning process for forming the dummy gate stacks 120A-120D. With the hard mask elements as an etching mask, one or more etching processes are used to partially remove the dummy gate dielectric material layer and the dummy gate electrode layer. As a result, remaining portions of the dummy gate dielectric material layer and the dummy gate electrode layer form the dummy gate dielectric layers 116 and the dummy gate electrodes 118 of the dummy gate stacks 120A-120D.

As shown in FIG. 3B, spacer layers 126 and 128 are deposited over the structure shown in FIG. 3A, in accordance with some embodiments. The spacer layers 126 and 128 extend along the sidewalls of the dummy gate stacks 120A and 120B. The spacer layers 126 and 128 are made of different materials. The spacer layer 126 may be made of a dielectric material that has a low dielectric constant. The spacer layer 126 may be made of or include silicon carbide, silicon oxycarbide, silicon oxide, one or more other suitable materials, or a combination thereof.

The spacer layer 128 may be made of a dielectric material that can provide more protection to the gate stacks during subsequent processes. The spacer layer 128 may have a greater dielectric constant than that of the spacer layer 126. The spacer layer 128 may be made of silicon nitride, silicon oxynitride, carbon-containing silicon nitride, carbon-containing silicon oxynitride, one or more other suitable materials, or a combination thereof. The spacer layers 126 and 128 may be sequentially deposited using a CVD process, an ALD process, a physical vapor deposition (PVD) process, one or more other applicable processes, or a combination thereof.

Figure 3C:
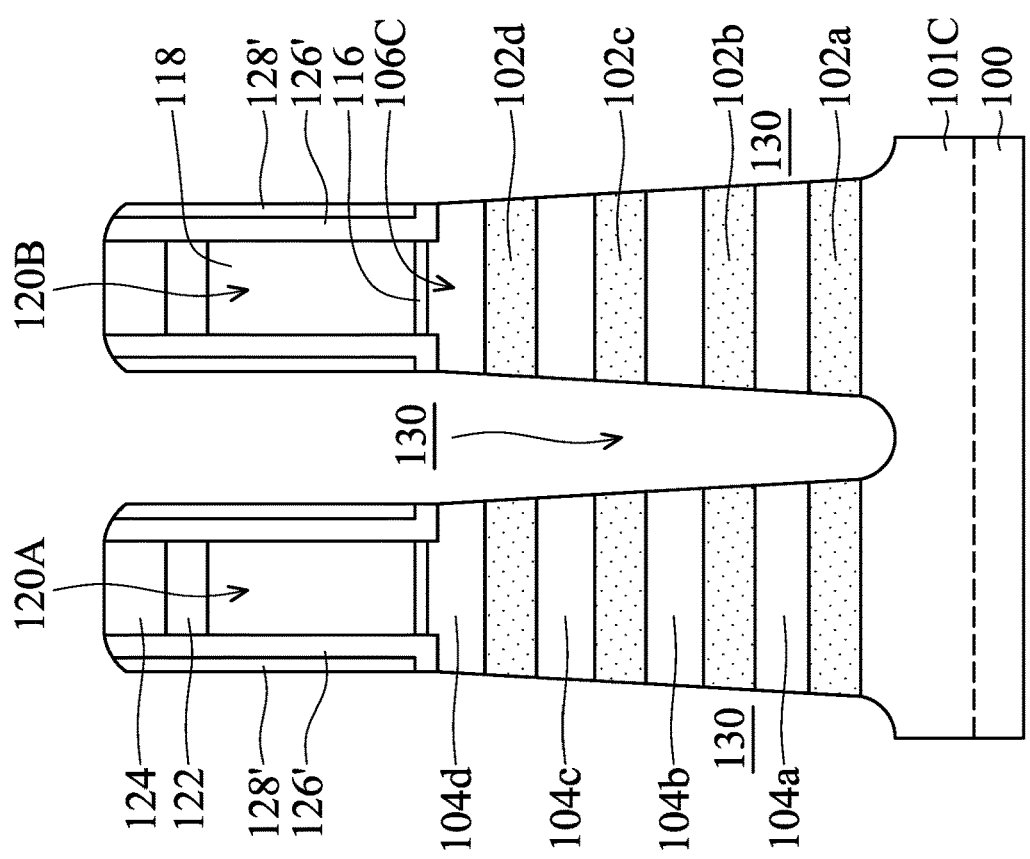
Figure 3F:
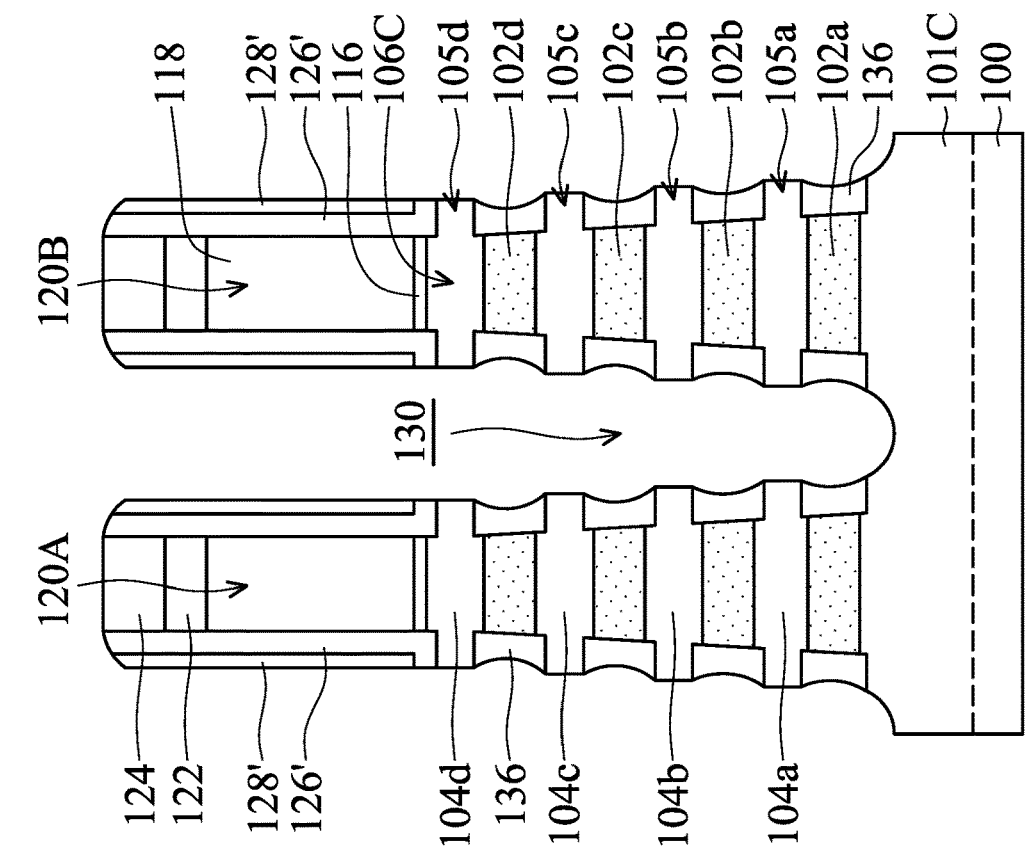

As shown in FIG. 3C, the spacer layers 126 and 128 are partially removed, in accordance with some embodiments. One or more anisotropic etching processes may be used to partially remove the spacer layers 126 and 128. As a result, remaining portions of the spacer layers 126 and 128 form spacer elements 126' and 128', respectively. The spacer elements 126' and 128' extend along the sidewalls of the dummy gate stacks 120A and 120B, as shown in FIG. 3C.

The fin structures 106A-106C are partially removed to form recesses 130 that are used to contain epitaxial structures (such as source/drain structures) that will be formed later. As shown in FIG. 3C, the fin structure 106C is partially removed to form the recesses 130, in accordance with some embodiments. One or more etching processes may be used to form the recesses 130. In some embodiments, each of the recesses 130 penetrates into the semiconductor fin 1010 of the fin structure 106C. In some embodiments, the spacer elements 126' and 128' and the recesses 130 are simultaneously formed using the same etching process, In some embodiments, each of the recesses 130 has slanted sidewalls. Upper portions of the recesses 130 are larger (or wider) than lower portions of the recesses 130. In these cases, due to the profile of the recesses 130, an upper semiconductor layer (such as the semiconductor layer 104d) is shorter than a lower semiconductor layer (such as the semiconductor layer 104a).

However, embodiments of the disclosure have many variations, In some other embodiments, the recesses 130 have substantially vertical sidewalls. In these cases, due to the profile of the recesses 130, an upper semiconductor layer (such as the semiconductor layer 104d) is substantially as wide as a lower semiconductor layer (such as the semiconductor layer 104a).

As shown in FIG. 3D, the semiconductor layers 102a-102d are laterally etched, in accordance with some embodiments. As a result, edges of the semiconductor layers 102a-102d retreat from edges of the semiconductor layers 104a-104d. As shown in FIG. 3D, recesses 132 are formed due to the lateral etching of the semiconductor layers 102a-102d. The recesses 132 may be used to contain inner spacers that will be formed later. The semiconductor layers 102a-1.02d may be laterally etched using a wet etching process, a dry etching process, or a combination thereof.

During the lateral etching of the semiconductor layers 102a-102d, the semiconductor layers 104a-1.04d may also be slightly etched. As a result, edge portions of the semiconductor layers 104a-1.04d are partially etched and thus shrink to become edge elements 105a-105d, as shown in FIG. 3D. As shown in FIG. 3D, each of the edge elements 105a-105d of the semiconductor layers 104a-104d is thinner than the corresponding inner portion of the semiconductor layers 104a-104d.

Figure 3E:
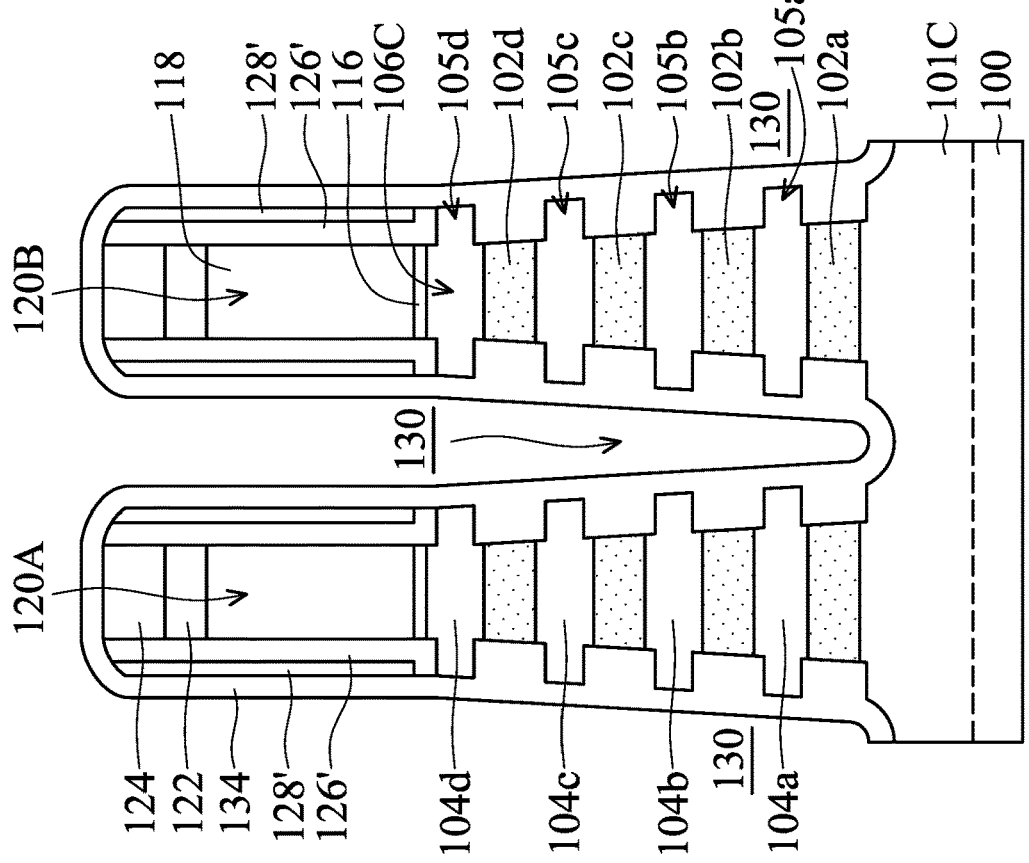

As shown in FIG. 3E, a spacer layer 134 is deposited over the structure shown in FIG. 3D, in accordance with some embodiments. The spacer layer 134 covers the dummy gate stacks 120A and 120B and overfills the recesses 132. The spacer layer 134 may be made of or include carbon-containing silicon nitride (SiCN), carbon-containing silicon oxynitride (SiOCN), carbon-containing silicon oxide (SiOC), one or more other suitable materials, or a combination thereof. The spacer layer 134 may be deposited using a CVD process, an ALD process, one or more other applicable processes, or a combination thereof.

As shown in FIG. 3F, an etching process is used to partially remove the spacer layer 134, in accordance with some embodiments. The remaining portions of the spacer layer 134 form inner spacers 136, as shown in FIG. 3F. The etching process may include a dry etching process, a wet etching process, or a combination thereof.

The inner spacers 136 cover the edges of the semiconductor layers 102a-102d that are originally exposed by the recesses 132. The inner spacers 136 may be used to prevent subsequently formed epitaxial structures (that function as, for example, source/drain structures) from being damaged during the subsequent process of removing the semiconductor layers 102a-102d. The inner spacers 136 may also be used to reduce parasitic capacitance between the subsequently formed source/drain structures and the gate stacks. As a result, the reliability and the operation speed of the semiconductor device structure may be improved.

In some embodiments, after the etching process for forming the inner spacers 136, portions of the semiconductor fin 101C previously covered by the spacer layer 134 are exposed by the recesses 130, as shown in FIG. 3F. The sidewalls of the edge elements 105a-105d, that are previously covered by the spacer layer 134, are also exposed by the recesses 130.

Figures 3G, 3H:
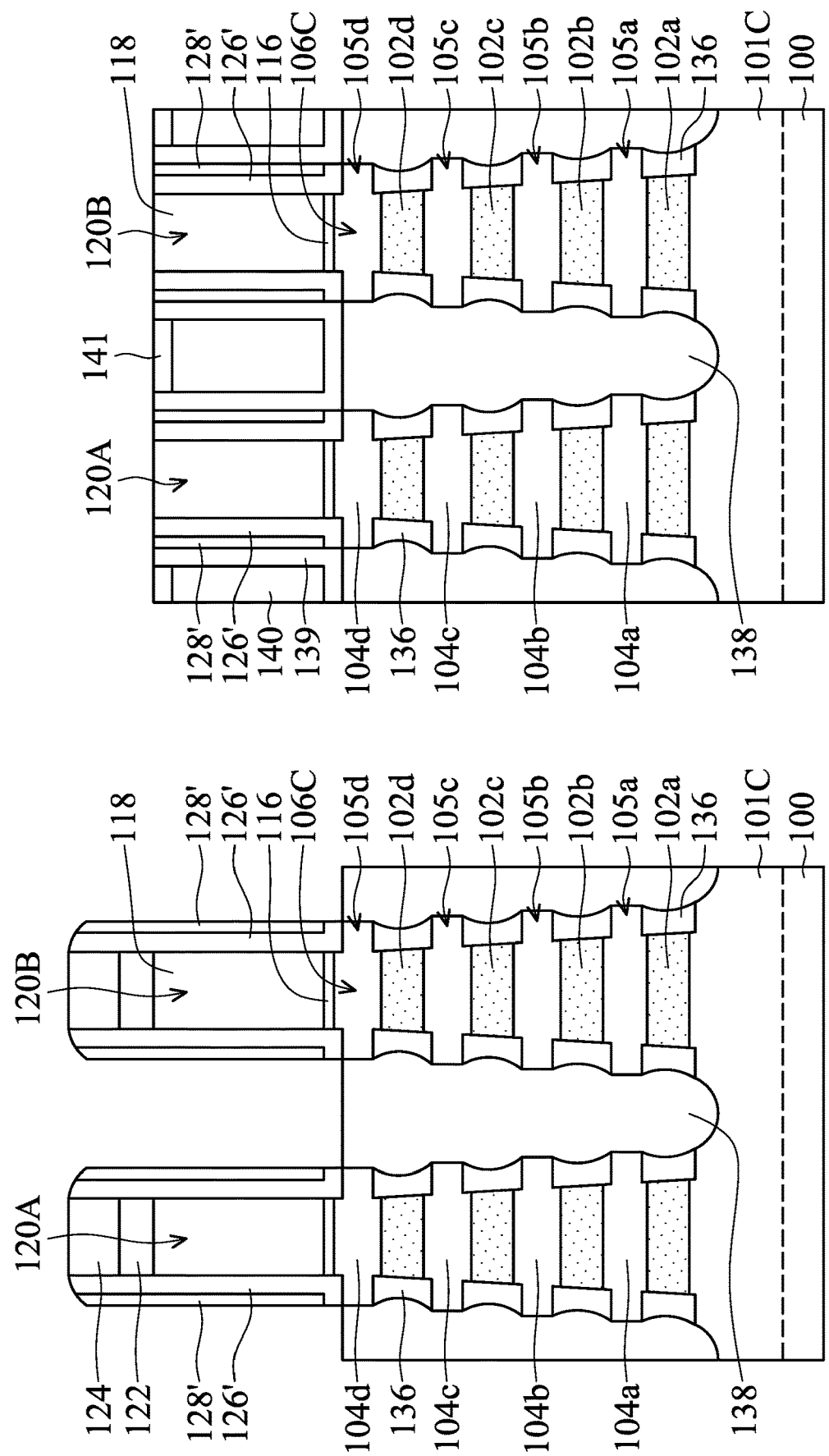
Figure 3J:
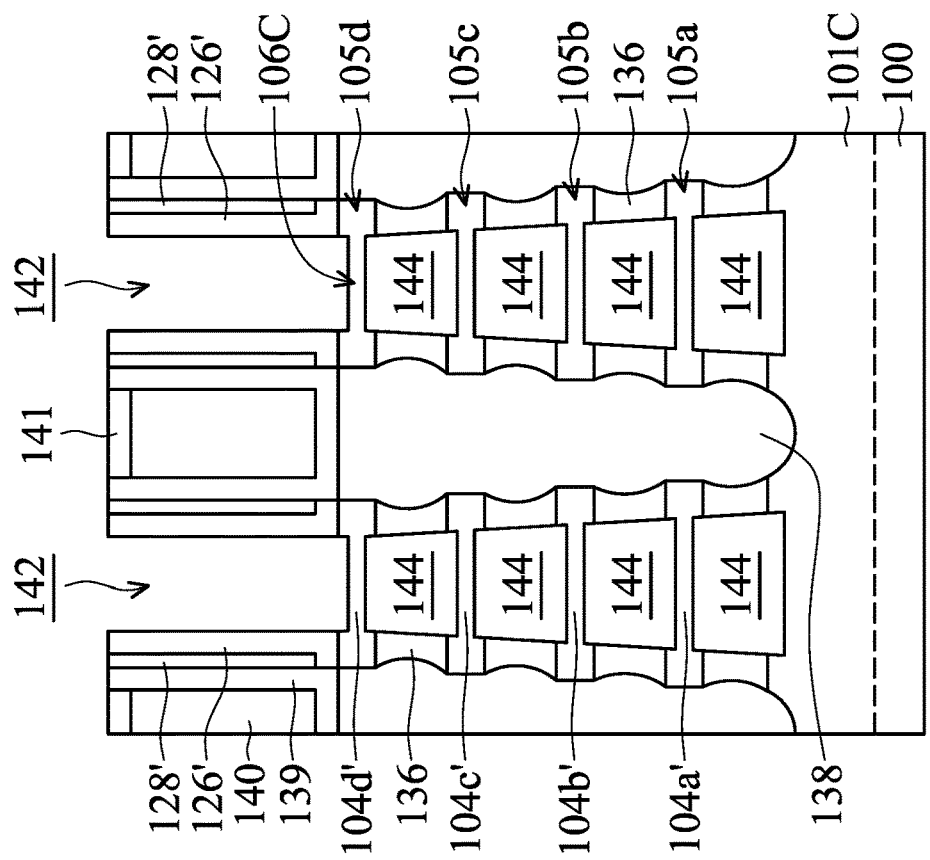

As shown in FIG. 3G, epitaxial structures 138 are formed beside the dummy gate stacks 120A and 120B, in accordance with some embodiments. In some embodiments, the epitaxial structures 138 fill the recesses 130, as shown in FIG. 3G. In some other embodiments, the epitaxial structures 138 overfill the recesses 130. In these cases, the top surfaces of the epitaxial structures 138 may be higher than the top surface of the dummy gate dielectric layer 116. In some other embodiments, the epitaxial structures 138 partially fill the recesses 130. For example, the epitaxial structures 138 extend along the sidewalls of the recesses 130 and surround the remaining portions of recesses 130 that are not occupied by the epitaxial structures 138.

In some embodiments, the epitaxial structures 138 connect to the semiconductor layers 104a-104d. Each of the semiconductor layers 104a-104d is sandwiched between two of the epitaxial structures 138. In some embodiments, the epitaxial structures 138 function as source/drain structures. In some embodiments, the epitaxial structures 138 are p-type doped regions. The epitaxial structures 138 may include epitaxially grown silicon germanium (SiGe), epitaxially grown silicon, or another suitable epitaxially grown semiconductor material. In some other embodiments, the epitaxial structures 138 are n-type regions. The epitaxial structures 138 may include epitaxially grown silicon, epitaxially grown silicon carbide (SiC), epitaxially grown silicon phosphide (SiP), or another suitable epitaxially grown semiconductor material.

In sonic embodiments, the epitaxial structures 138 are formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof.

In some embodiments, the epitaxial structures 138 are doped with one or more suitable dopants. For example, the epitaxial structures 138 are SiGe source/drain features or Si source/drain features that are doped with boron (B), gallium (Ga), indium (In), or another suitable dopant. In some other embodiments, the epitaxial structures 138 are Si source/drain features doped with phosphorous (P), antimony (Sb), or another suitable dopant.

In sonic embodiments, before the formation of the epitaxial structures 138, isolation elements are formed to fill bottom portions of the recesses 130. The isolation elements are used to prevent or reduce current leakage from the epitaxial structures 138. In sonic embodiments, the isolation elements are made of a semiconductor material. The isolation elements may be made of or include silicon germanium, silicon, one or more other suitable materials, or a combination thereof.

In sonic embodiments, the doping concentration of the isolation elements is much lower than that of the epitaxial structures 138. Therefore, current from the epitaxial structures 138 is isolated by the isolation elements and is prevented from entering the semiconductor fin 101C. In some other embodiments, the isolation elements contain substantially no dopant. In these cases, the doping concentration of isolation elements is substantially equal to zero.

In some embodiments, the isolation elements and the epitaxial structures 138 are formed in-situ in the same process chamber. The vacuum of the process chamber is not broken after the formation of the isolation elements and before the formation of the epitaxial structures 138.

In some embodiments, the epitaxial structures 138 are doped in-situ during their epitaxial growth. The initial reaction gas mixture for forming the epitaxial structures 138 contains dopants. In some other embodiments, the epitaxial structures 138 are not doped during the growth of the epitaxial structures 138. Instead, after the formation of the epitaxial structures 138, the epitaxial structures 138 are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 138 are further exposed to one or more annealing processes to activate the dopants. For example, a rapid thermal annealing process is used.

As shown in FIG. 3H, a contact etch stop layer 139 and a dielectric layer 140 are formed to cover the epitaxial structures 138 and to surround the dummy gate stacks 120A and 120B, in accordance with some embodiments. The contact etch stop layer 139 may be made of or include silicon nitride, silicon oxynitride, silicon carbide, aluminum oxide, one or more other suitable materials, or a combination thereof. The dielectric layer 140 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof.

In some embodiments, an etch stop material layer and a dielectric material layer are sequentially deposited over the structure shown in FIG. 3G. The etch stop material layer may be deposited using a CVD process, an ALD process, a PVD process, one or more other applicable processes, or a combination thereof. The dielectric material layer may be deposited using an FCVD process, a CVD process, an ALD process, one or more other applicable processes, or a combination thereof.

Afterwards, a planarization process is used to partially remove the etch stop material layer and the dielectric material layer. As a result, the remaining portions of the etch stop material layer and the dielectric material layer form the contact etch stop layer 139 and the dielectric layer 140, respectively. The planarization process may include a CMP process, a grinding process, an etching process, a dry polishing process, one or more other applicable processes, or a combination thereof.

In some embodiments, the mask layers 122 and 124 are removed during the planarization process. In some embodiments, after the planarization process, the top surfaces of the contact etch stop layer 139, the dielectric layer 140, and the dummy gate electrodes 118 are substantially level.

Afterwards, protective elements 141 are formed, as shown in FIG. 3H in accordance with some embodiments. The protective elements 141 may be used to protect the dielectric layer 140 thereunder during subsequent processes. The protective elements 141 may be made of or include silicon nitride, silicon oxynitride, silicon carbide, aluminum oxide, one or more other suitable materials, or a combination thereof.

In some embodiments, before the formation of the protective elements 141, the dielectric layer 140 is etched back to be lower than the tops of the contact etch stop layer 139 and the dummy gate electrodes 118. As a result, recesses are formed over the remaining portions of the dielectric layer 140. Afterwards, a protective material layer is deposited to overfill the recesses. Then, a planarization process is used to remove the portions of the protective material layer outside of the recesses. The remaining portions of the protective material layer form the protective elements 141. In some embodiments, the top surfaces of the contact etch stop layer 139, the protective elements 141, and the dummy gate electrodes 118 are substantially level.

Figure 3I:
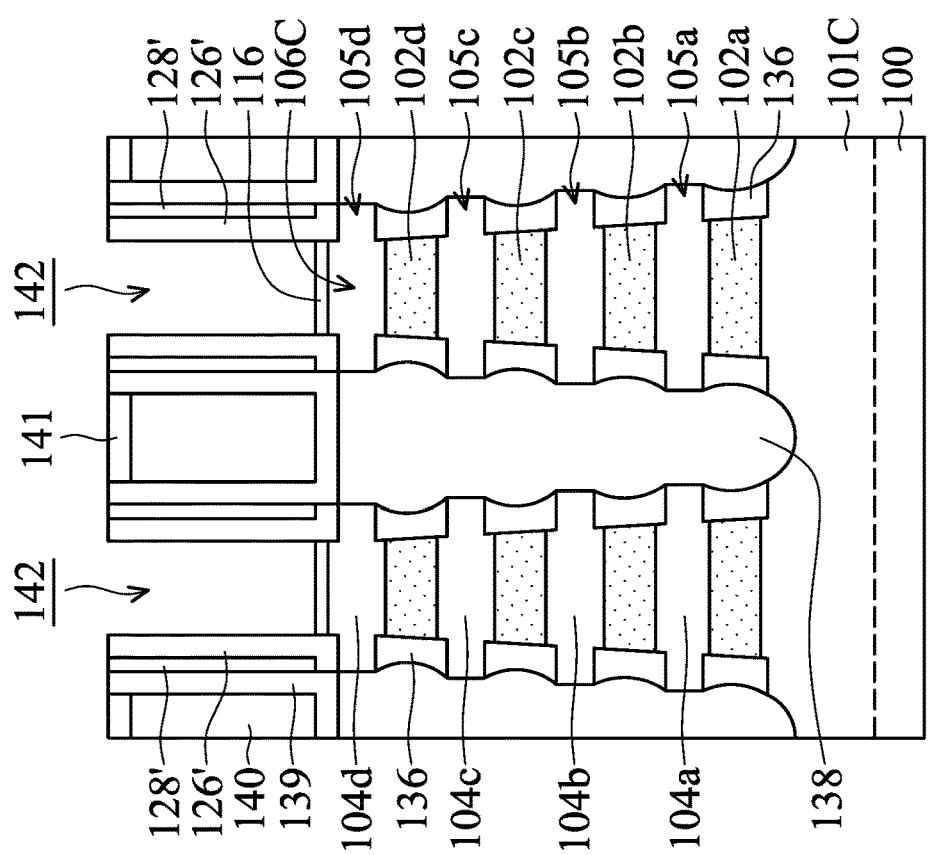
Figure 3N:
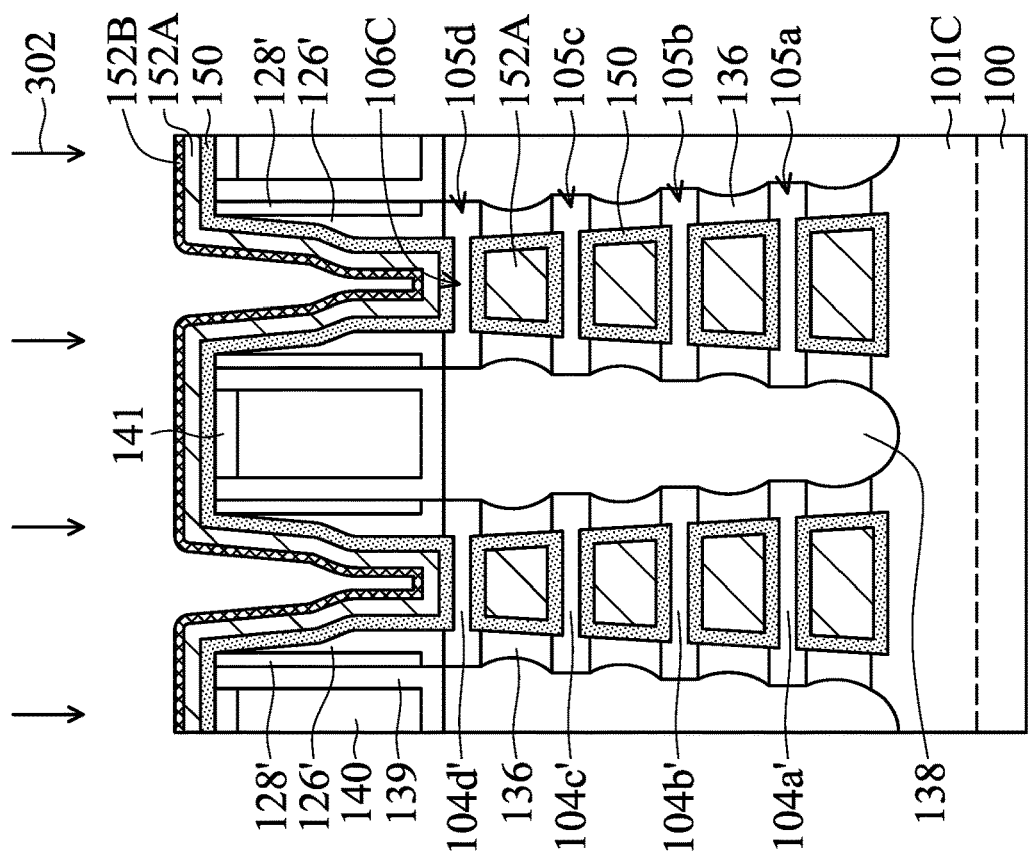

Afterwards, as shown in FIGS. 2I and 3I, one or more etching processes are used to remove the dummy gate stacks 120A and 120B, so as to form trenches 142, in accordance with some embodiments. The trenches 142 expose the sacrificial spacers 202 and the dielectric fin structures 210A and 210B that are originally covered by the dummy gate stacks 120A and 120B, as shown in FIG. 2I.

As shown in FIG. 2J, the dielectric fin structure 210B is partially removed to lower the height of the dielectric fin structure 210B, in accordance with some embodiments. After a subsequent formation of a metal gate stack, the dielectric fin structure 210A that is taller than the dielectric fin structure 210B may function as an isolation structure. The isolation structure may divide the subsequently formed metal gate stack into two parts that are electrically isolated from each other. The subsequently formed metal gate stack may extend across the dielectric fin structure 210B that is shorter than the dielectric fin structure 210A. Therefore, portions of the subsequently formed metal gate stack besides the dielectric fin structure 210B may remain electrically connected to each other.

In some embodiments, the dielectric fin structure 210B is lowered by partially or completely removing the protective structure 208B, as shown in FIG. 2J. One or more photolithography processes and one or more etching processes may be, used to remove the protective structure 208B.

As shown in FIGS. 2K and 3J, the semiconductor layers 102a-102d (that function as sacrificial layers) are removed to form recesses 144, in accordance with some embodiments. In some embodiments, an etching process is used to remove the semiconductor layers 102a-102d, Due to high etching selectivity, the semiconductor layers 104a-104d arc only slightly etched or completely not etched, The remaining portions of the semiconductor layers 104a-104d form multiple semiconductor nanostructures 104a'-104d' of the fin structures 106A-106C, as shown in FIGS. 2K and 3J. The semiconductor nanostructures 104a'-104d' are constructed by or made up of the remaining portions of the semiconductor layer 104a-104d. The semiconductor nanostructures 104a'-104d' suspended over the semiconductor fin 101A or 101B may function as channel structures of one or more transistors.

In some embodiments, the etchant used for removing the semiconductor layers 102a-102d also slightly removes the semiconductor layers 104a-104d that form the semiconductor nanostructures 104a'-104d'. As a result, the obtained semiconductor nanostructures 104a'-104d' become thinner after the removal of the semiconductor layers 102a-102d. In some embodiments, each of the semiconductor nanostructures 104a'-104d' is thinner than the edge elements 105a-105d since the edge elements 105a-105d are surrounded by other elements and thus are prevented from being reached and etched by the etchant.

After the removal of the semiconductor layers 102a-102d (that function as sacrificial layers), recesses 144 are formed, The recesses 144 connect to the trench 142 and surround each of the semiconductor nanostructures 104a'-104d'. As shown in 3J, even if the recesses 144 between the semiconductor nanostructures 104a'-104d' are formed, the semiconductor nanostructures 104a'-104d' remain being held by the epitaxial structures 138. Therefore, after the removal of the semiconductor layers 102a-102d (that function as sacrificial layers), the released semiconductor nanostructures 104a'-104d' are prevented from falling down.

During the removal of the semiconductor layers 102a-102d (that function as sacrificial layers), the inner spacers 136 protect the epitaxial structures 138 from being etched or damaged. The quality and reliability of the semiconductor device structure are ensured.

As shown in FIG. 3K. the spacer elements 126' are partially removed to enlarge upper portions of the trenches 142, in accordance with some embodiments. In sonic embodiments, upper portions of the trenches 142 gradually become narrower along a direction from the tops of the trenches 142 towards the semiconductor substrate 100. A subsequent formation of a metal gate stack may become easier due to the enlarged trenches 142.

In some embodiments, an etching process, such as an anisotropic etching process, is used to partially remove the spacer elements 126'. The conditions of the etching process arc fine-tuned to laterally etch upper portions of the spacer elements 126'. In some embodiments, a gas mixture is used as the reaction gas for performing the etching process. The gas mixture may include $CF_4$, $O_2$, $CHF_3$, $N_2$, Ar, $NF_3$, He, HBr, $Cl_2$, $SF_6$, $CH_4$, one or more other suitable gases, or a combination thereof. During the etching operations, the composition of the gas mixture may be varied according to requirements.

As shown in FIGS. 2L and 3L, a gate dielectric layer 150 is deposited to wrap around each of the semiconductor nanostructures 104a'-104d', in accordance with some embodiments. As shown in FIG. 3L, the gate dielectric layer 150 also extends along the sidewalls and the bottoms of the trenches 142. As shown in FIG. 2L, the gate dielectric layer 150 also extends along the sidewalls of the dielectric fin structures 210A and 210B.

In some embodiments, the gate dielectric layer 150 is made of or includes a dielectric material with high dielectric constant (high-K). The gate dielectric layer 150 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 150 may be deposited using an ALD process, a CVD process, one or more other applicable processes, or a combination thereof. The formation of the gate dielectric 150 may further involve one or more thermal operations.

In some embodiments, before the formation of the gate dielectric layer 150, an interfacial layers are formed on the surfaces of the semiconductor nanostructures 104a'-104d'. The interfacial layers are very thin and are made of, for example, silicon oxide or germanium oxide. In some embodiments, the interfacial layers are formed by applying an oxidizing agent on the surfaces of the semiconductor nanostructures 104a'-104d'. For example, a hydrogen peroxide-containing liquid may be applied or provided. on the surfaces of the semiconductor nanostructures 104a'-104d' so as to form the interfacial layers.

Figure 3M:
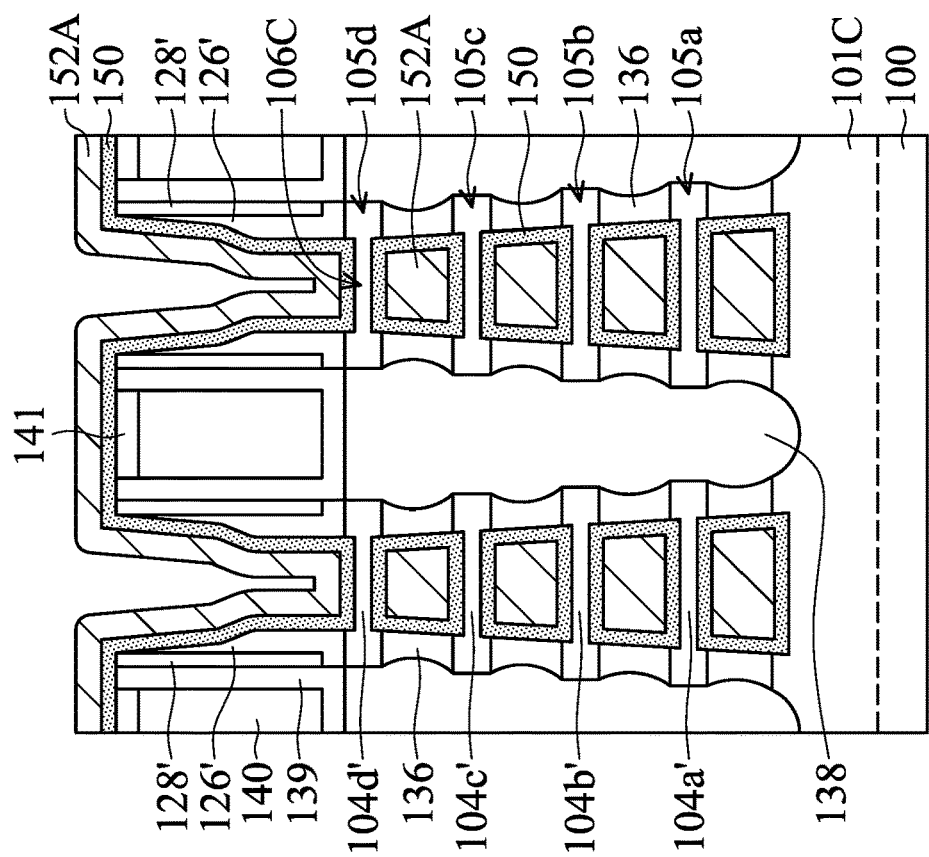

As shown in FIGS. 2M and 3M, a first work function layer 152A is deposited over the gate dielectric layer 150, in accordance with some embodiments. In some embodiments, the first work function layer 152A further extends into the recesses 144 to wrap around the semiconductor nanostructures 104a'-104d'. In some embodiments, the first work function layer 152A completely fills the remaining space of the recesses 144, as shown in FIGS. 2M and 3M. In some other embodiments, the first work function layer 152A partially fills the remaining space of the recesses 144.

The first work function layer 152A may be used to provide the desired work function for transistors to enhance device performance including improved threshold voltage. In some embodiments, the first work function layer 152A is a metal-containing layer. In some embodiments, the first work function layer 152A is used for forming a PHOS device. The first work function layer 152A is a p-type work function layer. The p-type work function layer is capable of providing a work function value suitable for the device. The p-type work function layer may include metal, metal carbide, metal nitride, other suitable materials, or a combination thereof. For example, the p-type metal includes tantalum nitride, tungsten nitride, titanium, titanium nitride, one or more other suitable materials, or a combination thereof.

In some embodiments, the first work function layer 152A is used for forming an NMOS device. The first work function layer 152A is an n-type work function layer. The n-type work function layer is capable of providing a work function value suitable for the device. The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC, TiAlO, TiAlN, one or more other suitable materials, or a combination thereof.

The first work function layer 152A may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combination thereof. The thickness and/or the compositions of the first work function layer 152A may be fine-tuned to adjust the work function level.

The first work function layer 152A may be deposited over the gate dielectric layer 150 using an ALD process, a CVD process, a PVD process, an electroplating process, an electroless plating process, one or more other applicable processes, or a combination thereof.

In some embodiments, the first work function layer 152A is deposited using a low temperature ALD process. For example, the first work function layer 152A is made of or includes titanium nitride that is formed using a low temperature ALD process. The deposition temperature of the first work function layer 152A may be in a range from about 250 degrees C. to about 350 degrees C. Due to the low deposition temperature, the first work function layer 152A may have a small average grain size. The average grain size of the first work function layer 152A may be in a range from about 3 nm to about 4 nm. Because the first work function layer 152A has a small average grain size, the filling ability of the first work function layer 152A is improved. The quality and reliability of the first work function layer 152A are also improved accordingly.

In some embodiments, a barrier layer is formed before the first work function layer 152A to allow the gate dielectric layer 150 to interface with the subsequently formed first work function layer 152A. The harrier layer may also be used to prevent diffusion between the gate dielectric layer 150 and the subsequently formed first work function layer 152A. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

However, embodiments of the disclosure are not limited thereto. Many variations and/or modifications can be made to embodiments of the disclosure. In some other embodiments, the barrier layer is not formed.

As shown in FIGS. 2N and 3N, an oxygen-containing layer 152B is formed over the first work function layer 152A, in accordance with some embodiments. In some embodiments, an operation 302 is performed to introduce oxygen-containing plasma on the first work function layer 152A. As a result, an upper portion of the first work function layer 152A is transformed into the oxygen-containing layer 152B, as shown in FIGS. 2N and 3N. In some embodiments, the oxygen-containing layer 152B is thinner than the first work function layer 152A. In some embodiments, the oxygen-containing layer 152B is in direct contact with the first work function layer 152A.

In some embodiments, the oxygen-containing layer 152B is a metal oxide layer. In some embodiments, the first work function layer 152A is made of or includes titanium nitride. In these cases, the oxygen-containing layer 152B may be made of or include titanium oxynitride. In some embodiments, the atomic concentration of oxygen of the oxygen-containing layer 152B gradually decreases along a direction from the surface of the oxygen-containing layer 152B towards the first work function layer 152A.

Figure 3O:
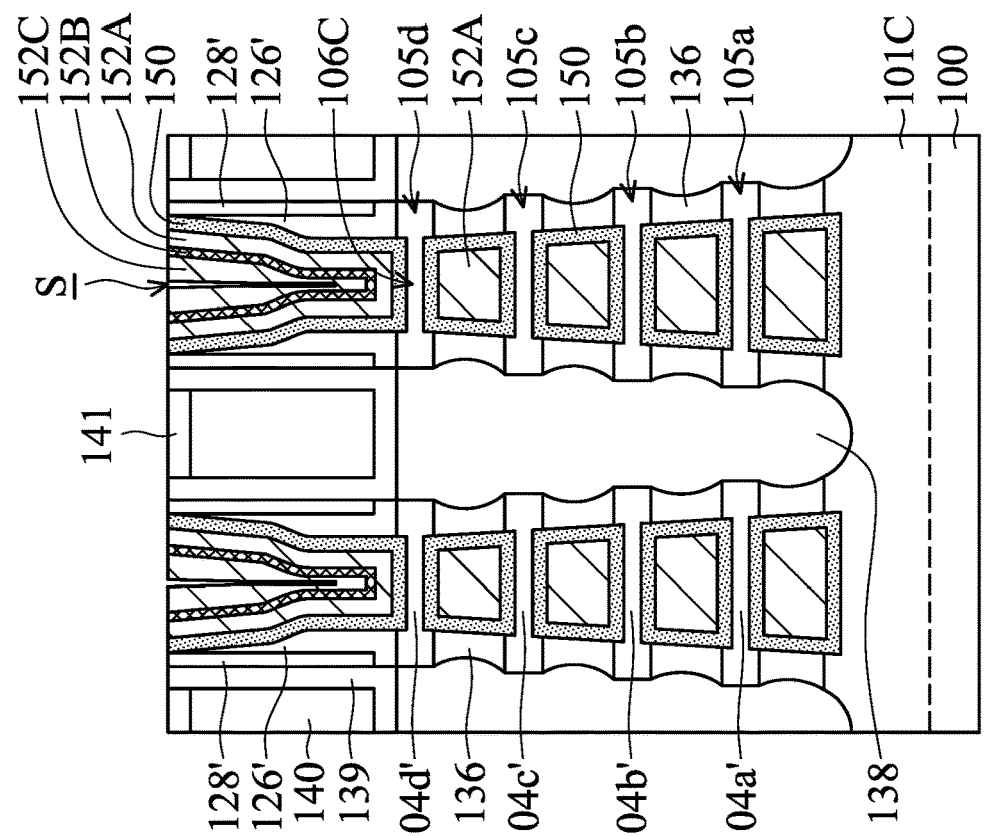

As shown in FIG. 3O, a second work function layer 152C is deposited over the oxygen-containing layer 152B, in accordance with some embodiments. In some embodiments, the oxygen-containing layer 152B is thinner than the second work function layer 152C. In some embodiments, the oxygen-containing layer 152B is in direct contact with the second work function layer 152C.

Similar to the first work function layer 152A, the second work function layer 152C may be used to provide the desired work function for transistors to enhance device performance including improved threshold voltage. In some embodiments, the second work function layer 152C is a metal-containing layer. In some embodiments, the second work function layer 152C is used for forming a PMOS device. The second work function layer 152C is a p-type work function layer. The p-type work function layer is capable of providing a work function value suitable for the device. The p-type work function layer may include metal, metal carbide, metal nitride, other suitable materials, or a combination thereof. For example, the p-type metal includes tantalum nitride, tungsten nitride, titanium, titanium nitride, one or more other suitable materials, or a combination thereof.

In some embodiments, the second work function layer 152C is used for forming an NMOS device. The second work function layer 152C is an n-type work function layer. The n-type work function layer is capable of providing a work function value suitable for the device. The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC, TiAlO, TiAlN, one or more other suitable materials, or a combination thereof.

The second work function layer 152C may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combination thereof. The thickness and/or the compositions of the second work function layer 152C may be fine-tuned to adjust the work function level. In some embodiments, the compositions of the first work function layer 152A and the second work function layer 152C are substantially the same.

The second work function layer 152C may be deposited over the gate dielectric layer 150 using an ALD process, a CVD process, a PVD process, an electroplating process, an electroless plating process, one or more other applicable processes, or a combination thereof.

In some, embodiments, the second work function layer 152C is deposited using a low temperature ALD process. For example, the second work function layer 152C is made of or includes titanium nitride that is formed using a low temperature ALD process. The deposition temperature of the second work function layer 152C may be in a range from about 250 degrees C. to about 350 degrees C.

Due to the low deposition temperature, the second work function layer 152C may have a small average grain size. The oxygen-containing layer 152B may also help to restrain the grain growth of the second work function layer 152O. In some embodiments, the average grain size of the second work function layer 152C is smaller than the average grain size of the first work function layer 152A. The average grain size of the second work function layer 152C may be in a range from about 2.8 nm to about 4 nm. Because the second work function layer 152C has a small average grain size, the filling ability of the second work function layer 152C is improved. The quality and reliability of the second work function layer 152C are also improved accordingly.

In some embodiments, due to the characteristics of the ALD process, one or more seams S are naturally formed in the second work function layer 152C, as shown in FIG. 3O. Even if the operation time of the ALD process is extended, no more metal-containing material can be deposited on sidewalls of the seam S to fill the seam S. Due to the low deposition temperature of the work function layers and the grain growth restraining by the oxygen-containing layer 152B, the average grain size of work function layers is small, which leads to good filling ability of the first work function layer 152A and the second work function layer 152C. As a result, the widths of the seams S may be kept narrow. Any negative effect caused by the seams S is significantly reduced.

Figure 3P:
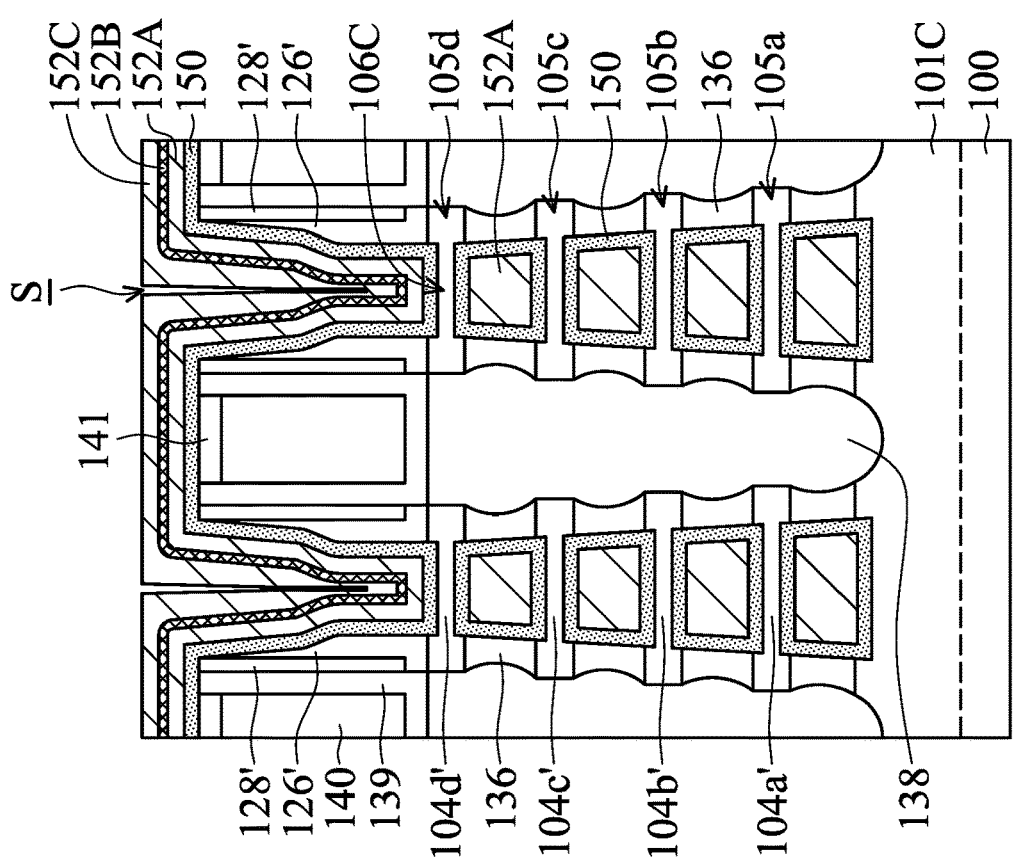

As shown in FIGS. 2O and 3P, a planarization process is used to remove the portions of the gate dielectric layer 150, the first work function layer 152A, the oxygen-containing layer 152B, and the second work function layer 152C outside of the trenches 142, in accordance with some embodiments. The planarization process may include a CMP process, a grinding process, an etching process, one or more other applicable processes, or a combination thereof. The protective elements 141 may function as a stop layer of the planarization process.

Figure 3Q:
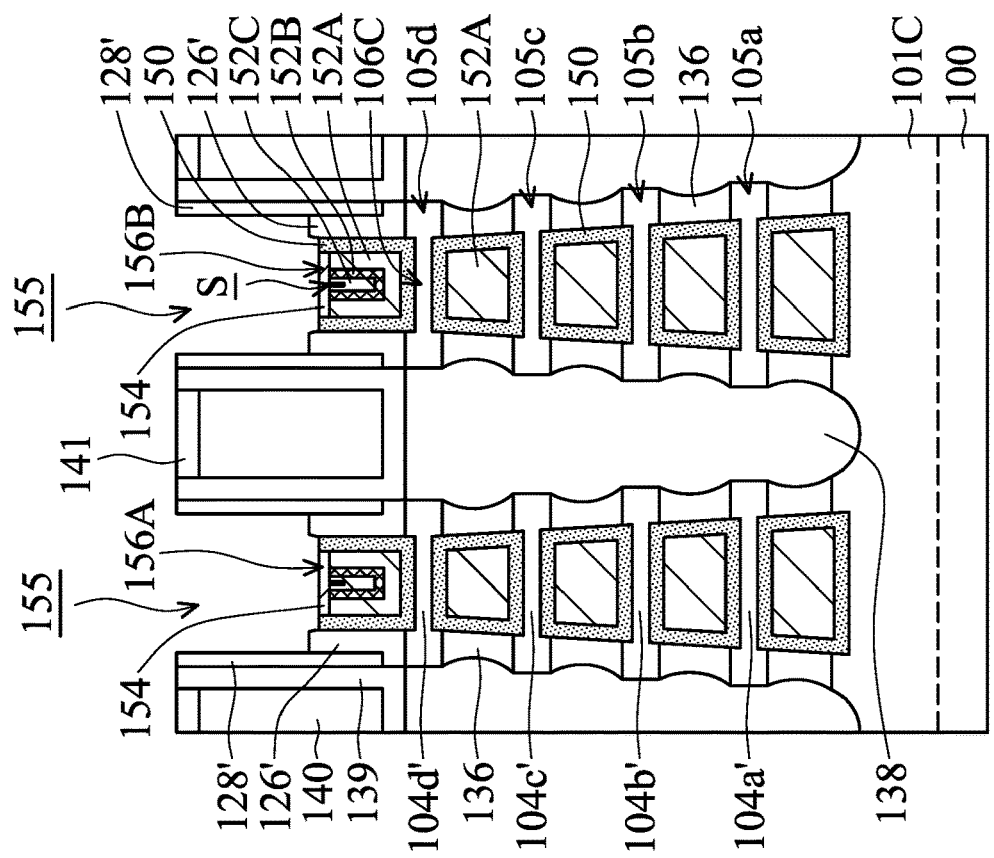

As shown in FIGS. 2P and 3Q, an etching back process is performed to partially remove the first work function layer 152A, the oxygen-containing layer 152B, and the second work function layer 152C, in accordance with some embodiments. As a result. recesses 155 are formed. The recesses 155 may be used to contain subsequently formed metal caps and dielectric protective elements. In some embodiments, the gate dielectric layer 150 and the spacer elements 126' are also partially removed during the etching back process.

As mentioned above, due to the good filling ability of the work function layers with small average grain sizes, the widths of the seams S may be kept narrow. The etching back process becomes much easier to be performed. The heights of the remaining portions of the first work function layer 152A, the oxygen-containing layer 152B, and the second work function layer 152C may thus be maintained in an acceptable range. The reliability and performance of the semiconductor device structure are greatly improved.

In some embodiments, after the etching back process, the top surfaces of the work function layers (such as the first work function layer 152A) are lower than the top surface of the dielectric fin structure 210A, as shown in FIG. 2P. In some embodiments, the top surfaces of the work function layers (such as the first work function layer 152A) are higher than the top surface of the dielectric fin structure 210B, as shown in FIG. 2P.

Figure 3R:
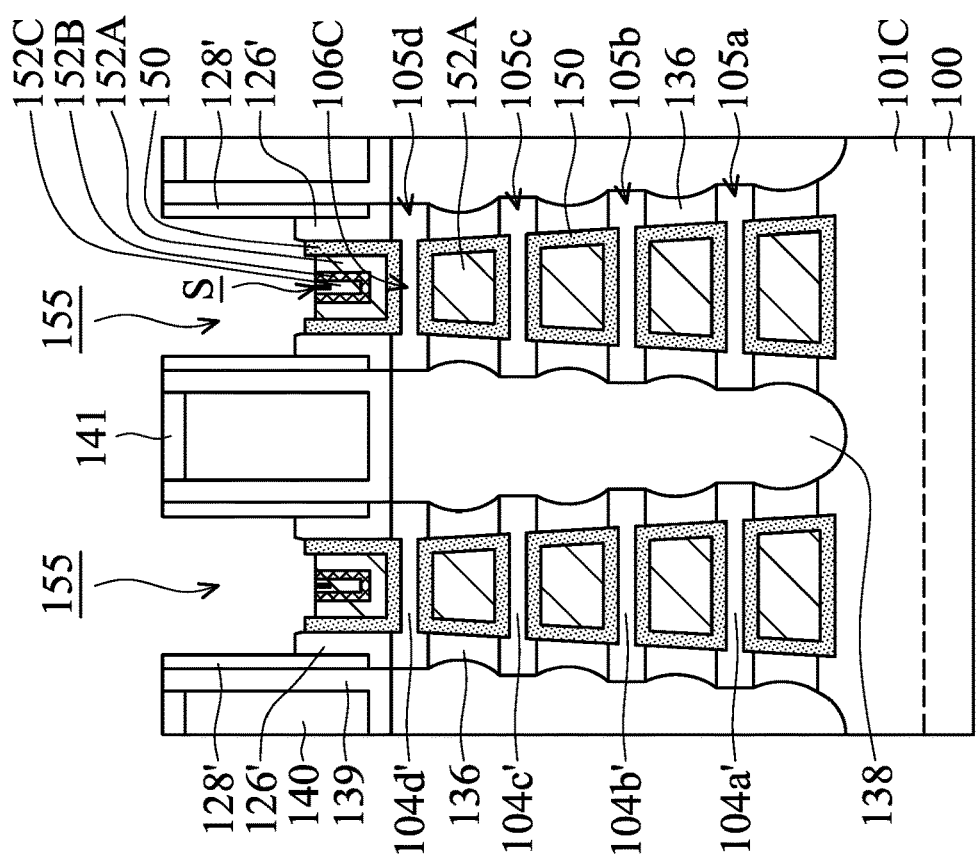
Figure 3S:
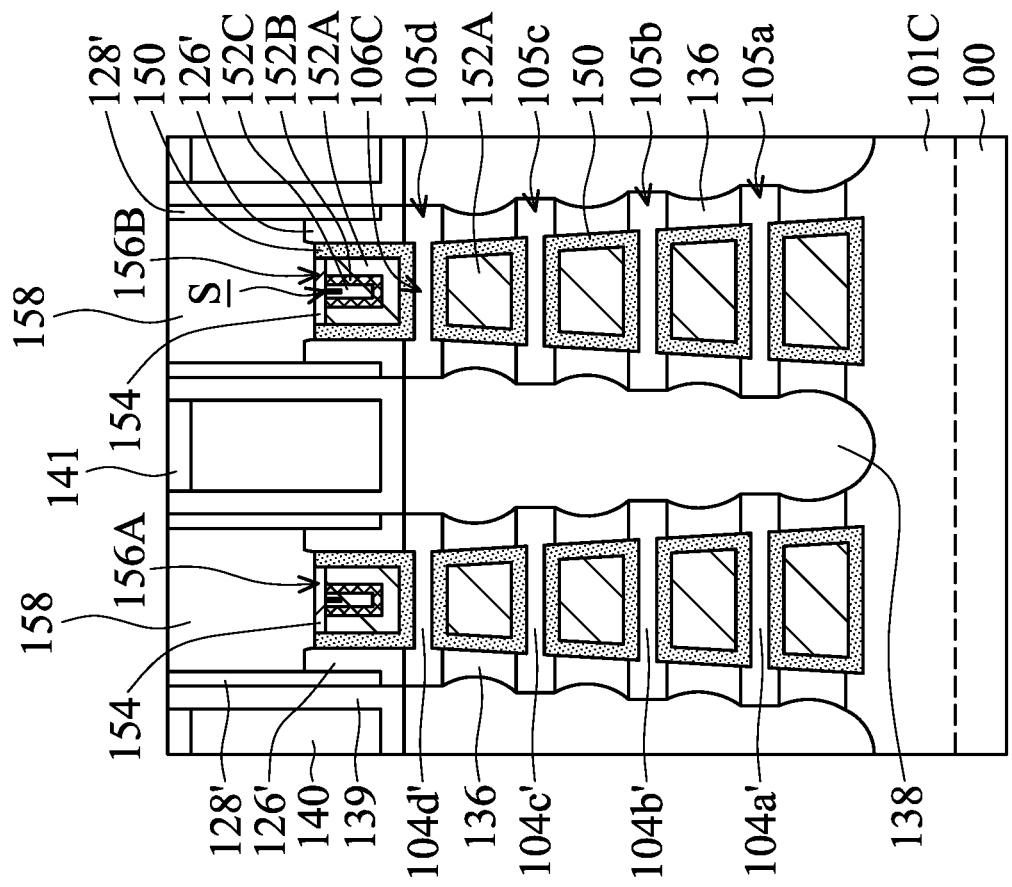

As shown in FIGS. 2Q and 3R, metal-containing caps 154 are formed on the top surfaces of the first work function layer 152A, the oxygen-containing layer 152B, and the second work function layer 152C, in accordance with some embodiments. The metal-containing caps 154 may be made of or include tungsten, aluminum, copper, cobalt, one or more other suitable materials, or a combination thereof. The metal-containing caps 154 may be formed using an ALD process, an electroplating process, an electroless plating process, a CVD process, a PVD process, one or more other applicable processes, or a combination thereof. In some embodiments, the material used for forming the metal-containing caps 154 is selectively deposited only on the surfaces of metal-containing materials.

As shown in FIG. 3R, the gate dielectric layer 150, the first work function layer 152A, the oxygen-containing layer 152B, the second work function layer 152C, and the metal-containing caps 154 together form metal gate stacks 156A and 156B. Due to the good filling ability of the work function layers with small average grain sizes, the widths of the seams S may be kept narrow. The etching back process becomes much easier to be performed. The uniformity of the heights of the metal gate stacks 156A and 156B is greatly improved, which results in better reliability and performance of the semiconductor device structure.

As shown in FIG. 2Q, the dielectric fin structure 210A that is taller than the dielectric fin structure 210B may function as an isolation structure that divides the metal gate stack 156B into a first part 156B$_1$ and a second part 156B$_2$. Due to the isolation of the dielectric fin structure 210A, the first part 156B$_1$ and the second part 156B$_2$ are electrically isolated from each other. As shown in FIG. 2Q, the first part 156B$_1$ of the metal gate stack 156B extends across the dielectric fin structure 210B that is shorter than the dielectric fin structure 210A. Therefore, portions of the metal gate stack 156B besides the dielectric fin structure 210B may remain electrically connected to each other, As shown in FIGS. 2R and 3S, dielectric protective elements 158 are formed in the recesses 155, in accordance with some embodiments. The dielectric protective elements 158 may be made of or include silicon nitride, silicon oxynitride, silicon carbide, silicon carbon nitride, oxide, another similar material, another suitable material, or a combination thereof. In some embodiments, a dielectric protective layer is deposited to overfill the recesses 155, The dielectric protective layer may be deposited using an ALD process, a CVD process, an FCVD process, one or more other applicable processes, or a combination thereof.

Afterwards, the portions of the dielectric protective layer outside of the recesses 155 are removed. As a result, the remaining portion of the dielectric protective layer in the recesses 155 form the dielectric protective elements 158, as shown in FIGS. 2R and 3S. In some embodiments, a planarization process is used to partially remove the dielectric protective layer. In some embodiments, the planarization process includes a CMP process, a grinding process, an etching process, one or more other applicable processes, or a combination thereof.

In some embodiments, one oxygen-containing layer is formed to restrain the grain growth of a subsequently formed work function layer, so as to enhance the filling ability of the work function layer. The reliability and performance of metal gate stacks are improved. However, embodiments of the disclosure are not limited thereto. Many variations and/or modifications can be made to embodiments of the disclosure. In some other embodiments, two or more oxygen-containing layers are formed to assist in the formation of metal gate stacks.

Figure 4:
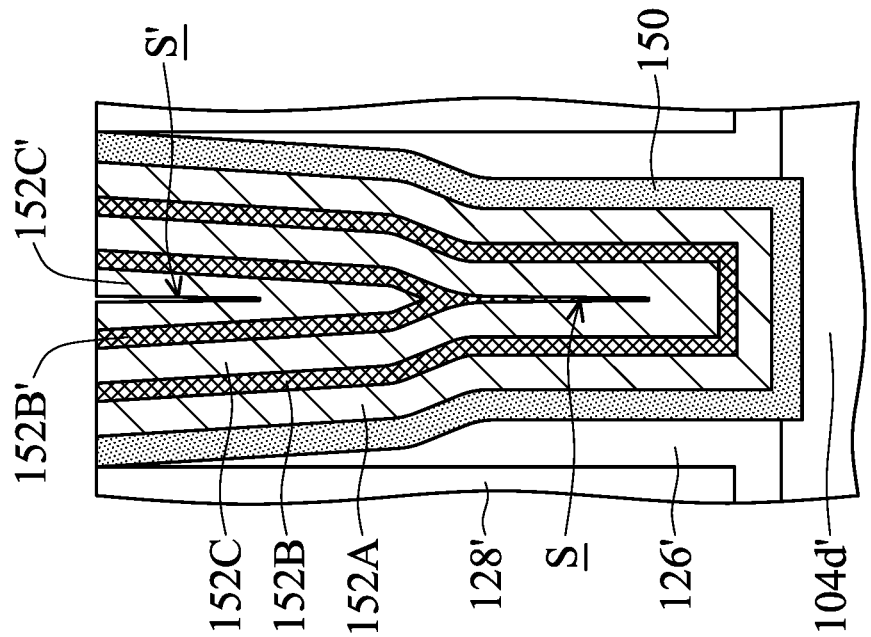
FIG. 4 is a cross-sectional view of an intermediate stage of a process for forming a portion of a semiconductor device structure, in accordance with some embodiments.

FIG. 4 is a cross-sectional view of an intermediate stage of a process for forming a portion of a semiconductor device structure, in accordance with some embodiments. In some embodiments for forming a wider metal gate stack, a second oxygen-containing layer 152B' is formed on the second work function layer 152C. The material and formation method of the second oxygen-containing layer 152B' may be the same as or similar to those of the oxygen-containing layer 152B.

Afterwards, a third work function layer 152C' is formed on the second oxygen-containing layer 152B', as shown in FIG. 4 in accordance with some embodiments. Due to the second oxygen-containing layer 152B', the grain growth of the third work function layer 152C' is restrained. Therefore, the third work function layer 152C' may have good filling ability. In some embodiments, there is a seam S' formed in the third work function layer 152C'. Similar to the seam S, the width of the seam S' may be kept narrow. Any negative effect caused by the seam S' is significantly reduced.

Embodiments of the disclosure form a semiconductor device structure with a metal gate stack. One or more oxygen-containing layers (such as metal oxide layers) are formed between work function layers. The oxygen-containing layers may help to restrain the grain growth of the work function layers. The work function layers with smaller grain size may have a better filling ability, which significantly prevents or reduces the formation of seams in the work function layers. Any negative effect caused by the seam is accordingly reduced, which ensures an uniform quality of the metal gate stack. The performance and reliability of the semiconductor device structure are thus greatly improved.

In accordance with some embodiments, a method for forming a semiconductor device structure is provided. The method includes forming a fin structure over a substrate, and the fin structure has multiple sacrificial layers and multiple semiconductor layers laid out alternately. The method also includes removing the sacrificial layers to release multiple semiconductor nanostructures made up of remaining portions of the semiconductor layers. The method further includes forming a gate dielectric layer to wrap around the semiconductor nanostructures and forming a first metal-containing layer over the gate dielectric layer to wrap around the semiconductor nanostructures. In addition, the method includes introducing oxygen-containing plasma on the first metal-containing layer to transform an upper portion of the first metal-containing layer into a metal oxide layer. The method includes forming a second metal-containing layer over the metal oxide layer.

In accordance with some, embodiments, a method for forming a semiconductor device structure is provided. The method includes forming a fin structure over a substrate, and the fin structure has multiple sacrificial layers and multiple semiconductor layers laid out alternately. The method also includes removing the sacrificial layers to form multiple semiconductor nanostructures made up of remaining portions of the semiconductor layers. The method further includes forming a gate dielectric layer to wrap around the semiconductor nanostructures and forming a first work function layer over the gate dielectric layer. In addition, the method includes forming an oxygen-containing layer over the first work function layer, and the oxygen-containing layer is thinner than the first work function layer. The method includes forming a second work function layer over the oxygen-containing layer, and the oxygen-containing layer is thinner than the second work function layer.

In accordance with some embodiments, a semiconductor device structure is provided. The semiconductor device structure includes multiple semiconductor nanostructures and two epitaxial structures. Each of the semiconductor nanostructures is between the epitaxial structures. The semiconductor device structure also includes a metal gate stack wrapped around the semiconductor nanostructures. The metal gate stack includes a gate dielectric layer, a first work function layer over the gate dielectric layer, and a metal oxide layer on the first work function layer. The metal oxide layer is thinner than the first work function layer. The metal gate stack also includes a second work function layer over the metal oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a fin structure over a substrate, wherein the fin structure has a plurality of sacrificial layers and a plurality of semiconductor layers laid out alternately;
   removing the sacrificial layers to release a plurality of semiconductor nanostructures made up of remaining portions of the semiconductor layers;
   forming a gate dielectric layer to wrap around the semiconductor nanostructures;
   forming a first metal-containing layer over the gate dielectric layer to wrap around the semiconductor nanostructures;
   introducing oxygen-containing plasma on the first metal-containing layer to transform an upper portion of the first metal-containing layer into a metal oxide layer; and
   forming a second metal-containing layer over the metal oxide layer.

2. The method for forming a semiconductor device structure as claimed in claim 1, further comprising:
   performing an etching back process to partially remove the first metal-containing layer, the metal oxide layer, and the second metal-containing layer; and
   forming a metal-containing cap over top surfaces of the first metal-containing layer, the metal oxide layer, and the second metal-containing layer.

3. The method for forming a semiconductor device structure as claimed in claim 1, wherein the first metal-containing layer is formed at a temperature that is in a range from about 250 degrees C. to about 350 degrees C.

4. The method for forming a semiconductor device structure as claimed in claim 1, wherein the second metal-containing layer is formed at a temperature that is in a range from about 250 degrees C. to about 350 degrees C.

5. The method for forming a semiconductor device structure as claimed in claim 1, wherein the first metal-containing layer and the second metal-containing layer are formed using an atomic layer deposition process.

6. The method for forming a semiconductor device structure as claimed in claim 1, wherein the first metal-containing layer and the second metal-containing layer comprises titanium nitride.

7. The method for forming a semiconductor device structure as claimed in claim 1, wherein the first metal-containing layer has a first average grain size, the second metal-containing layer has a second average grain size, and the first average grain size is greater than the second average grain size.

8. The method for forming a semiconductor device structure as claimed in claim 1, further comprising:
   forming a dielectric fin structure over the substrate before the semiconductor nanostructures are formed, wherein the dielectric fin structure is beside the fin structure;
   performing an etching back process to partially remove the first metal-containing layer, the metal oxide layer, and the second metal-containing layer so that top surfaces of the first metal-containing layer, the metal oxide layer, and the second metal-containing layer are lower than a top surface of the dielectric fin structure; and
   forming a metal-containing cap over the top surfaces of the first metal-containing layer, the metal oxide layer, and the second metal-containing layer, wherein a top surface of the metal-containing cap is lower than the top surface of the dielectric fin structure.

9. The method for forming a semiconductor device structure as claimed in claim 8, further comprising:
   forming a dielectric protective element over the metal-containing cap and the dielectric fin structure.

10. The method for forming a semiconductor device structure as claimed in claim 1, further comprising:
    introducing oxygen-containing plasma on the second metal-containing layer to transform an upper portion of the second metal-containing layer into a second metal oxide layer; and
    forming a third metal-containing layer over the second metal oxide layer.

11. A method for forming a semiconductor device structure, comprising:
    forming a fin structure over a substrate, wherein the fin structure has a plurality of sacrificial layers and a plurality of semiconductor layers laid out alternately;
    removing the sacrificial layers to form a plurality of semiconductor nanostructures made up of remaining portions of the semiconductor layers;
    forming a gate dielectric layer to wrap around the semiconductor nanostructures;
    forming a first work function layer over the gate dielectric layer;
    forming an oxygen-containing layer over the first work function layer, wherein the oxygen-containing layer is thinner than the first work function layer; and
    forming a second work function layer over the oxygen-containing layer, wherein the oxygen-containing layer is thinner than the second work function layer.

12. The method for forming a semiconductor device structure as claimed in claim 11, further comprising:
    introducing oxygen-containing plasma on the first work function layer to transform an upper portion of the first work function layer into the oxygen-containing layer.

13. The method for forming a semiconductor device structure as claimed in claim 11, wherein compositions of the first work function layer and the second work function layer are the same.

14. The method for forming a semiconductor device structure as claimed in claim 11, wherein the first work function layer has a first average grain size, the second work function layer has a second average grain size, and the first average grain size is greater than the second average grain size.

15. The method for forming a semiconductor device structure as claimed in claim 11, further comprising:
    forming a dielectric protective element over top surfaces of the first work function layer, the oxygen-containing layer, and the second work function layer.

16. A method for forming a semiconductor device structure, comprising:
    forming a channel structure over a substrate;
    forming a gate dielectric layer along a top and sidewalls of the channel structure;
    forming a first metal-containing layer over the gate dielectric layer;
    introducing oxygen into the first metal-containing layer to transform an upper portion of the first metal-containing layer into a metal oxide layer; and
    forming a second metal-containing layer on the metal oxide layer, wherein the first metal-containing layer has a first average grain size, the second metal-containing layer has a second average grain size, and the first average grain size is greater than the second average grain size.

17. The method for forming a semiconductor device structure as claimed in claim 16, wherein each of the first metal-containing layer and the second metal-containing layer contains titanium.

18. The method for forming a semiconductor device structure as claimed in claim 16, further comprising:
   introducing oxygen into the second metal-containing layer to transform an upper portion of the second metal-containing layer into a second metal oxide layer; and
   forming a third metal-containing layer over the second metal oxide layer.

19. The method for forming a semiconductor device structure as claimed in claim 16, further comprising:
   forming a dielectric protective element on top surfaces of the first metal-containing layer, the oxygen-containing layer, and the second metal-containing layer.

20. The method for forming a semiconductor device structure as claimed in claim 16, wherein the introducing oxygen into the first metal-containing layer is performed by introducing an oxygen-containing plasma on the first metal-containing layer.

\* \* \* \* \*